(12) United States Patent
Lian et al.

(10) Patent No.: US 8,077,002 B2
(45) Date of Patent: Dec. 13, 2011

(54) OPEN MRI MAGNETIC FIELD GENERATOR

(76) Inventors: Jianyu Lian, Quincy, MA (US); Grum Teklemariam, Arlington, VA (US); Xiaoping Hu, Tucker, GA (US)

(*) Notice: Subject to any disclaimer, the term of this patent is extended or adjusted under 35 U.S.C. 154(b) by 290 days.

(21) Appl. No.: 12/158,302

(22) PCT Filed: Dec. 6, 2006

(86) PCT No.: PCT/US2006/046436
§ 371 (c)(1),
(2), (4) Date: Nov. 25, 2008

(87) PCT Pub. No.: WO2007/094844
PCT Pub. Date: Aug. 23, 2007

(65) Prior Publication Data
US 2009/0085700 A1    Apr. 2, 2009

Related U.S. Application Data

(60) Provisional application No. 60/751,450, filed on Dec. 19, 2005.

(51) Int. Cl.
*H01F 7/02* (2006.01)
(52) U.S. Cl. .................... 335/306; 335/296; 335/302
(58) Field of Classification Search ............ 335/216, 335/296–299, 302–306
See application file for complete search history.

(56) References Cited

U.S. PATENT DOCUMENTS

| | | | | |
|---|---|---|---|---|
| 4,408,752 A * | 10/1983 | Uchikune et al. | ............. | 269/8 |
| 5,061,897 A * | 10/1991 | Danby et al. | ............. | 324/318 |
| 5,757,018 A * | 5/1998 | Mack et al. | ............. | 250/492.21 |
| 5,882,112 A * | 3/1999 | Peter | ............. | 366/75 |
| 6,198,286 B1 * | 3/2001 | Trequattrini et al. | ........ | 324/319 |
| 6,340,888 B1 * | 1/2002 | Aoki et al. | ............. | 324/319 |
| 6,411,187 B1 * | 6/2002 | Rotem et al. | ............. | 335/296 |
| 6,621,267 B1 * | 9/2003 | Damadian et al. | ........ | 324/319 |
| 6,982,620 B1 * | 1/2006 | Danby et al. | ............. | 335/299 |
| 7,796,002 B2 * | 9/2010 | Hashimoto et al. | ......... | 335/306 |
| 2005/0146329 A1 * | 7/2005 | Teklemariam et al. | ...... | 324/318 |
| 2009/0243774 A1 * | 10/2009 | Aoki et al. | ............. | 335/284 |

* cited by examiner

*Primary Examiner* — Anh Mai
*Assistant Examiner* — Bernard Rojas
(74) *Attorney, Agent, or Firm* — Bay State IP, LLC; Adam J. Bruno

(57) ABSTRACT

A magnet primarily for use in MRI applications comprises a pair of poles oriented about a plane of symmetry parallel to each therebetween defining an air gap region, magnetic field sources secured on the surfaces of the poles opposite the air gap that have yokes disposed on them, the yokes connected to each other by returns so that the entire magnet assembly can form a closed magnetic flux circuit to substantially confine the magnetic fields generated by the apparatus in the air gap where an imaging region is formed to place subjects for the purposes of examination. The main assembly being cylindrical in geometry has permanent magnets for magnetic field sources that are composed of two regions, a central disk-like portion magnetized substantially along the axial direction and an outer ring-like region magnetized substantially along the radial direction extending axially to form part of the pole together producing a very efficient and even flux distribution throughout the entire magnet assembly with minimal flux leakage. A further means of reducing flux leakage is incorporated in the yokes which have two sections, a disk-like region and an ring-like section to enclose the permanent magnets. The poles are made of multiple sections with a central disk-like region and an outer ring-like region that is a combination of permanent magnets and high permeability materials. This magnet assembly can achieve 1.0 Tesla or greater magnetic fields for whole-body scanning without saturating the magnet pole and other structures.

12 Claims, 22 Drawing Sheets

140,000ppm on 40cm DSV

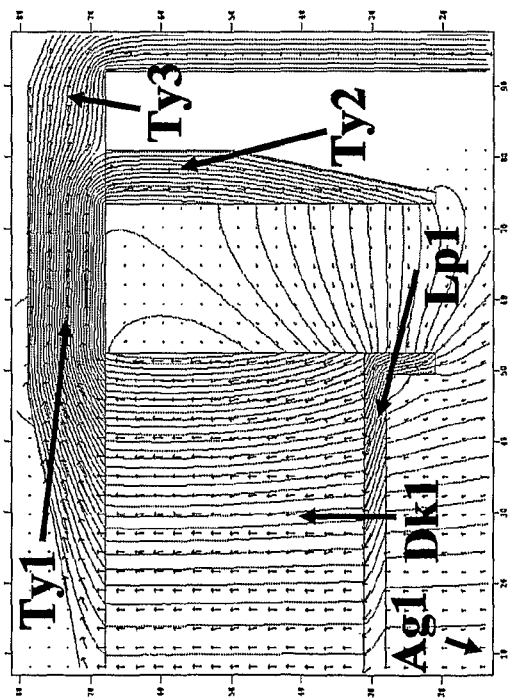
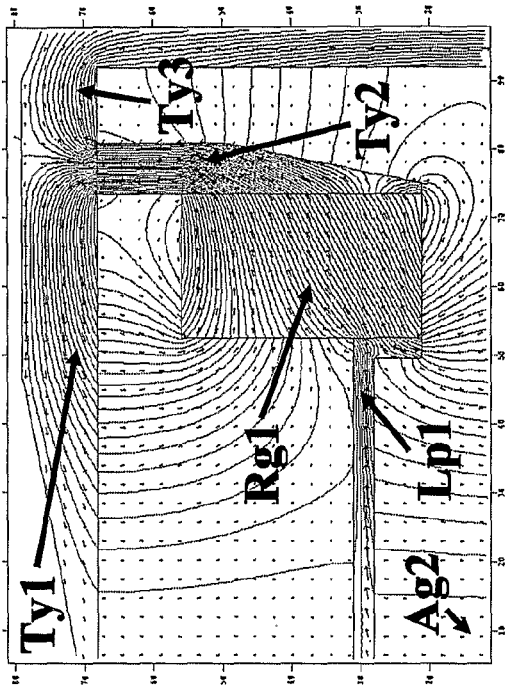
Fig. 18a
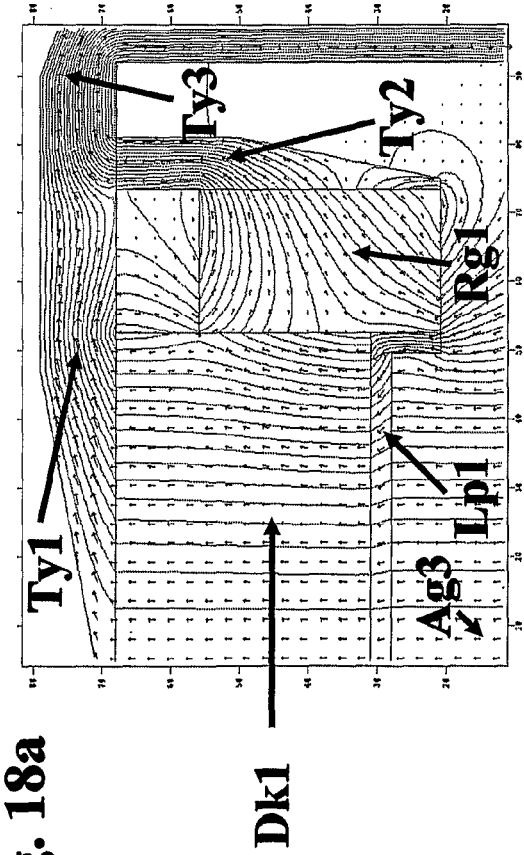
Fig. 18b
Fig. 18c

| Case | 111 | 118 | 128 | 126 | 117a | 117b | 120c | 120d | 122 | 113 | 124 | $B_0$ (G) | 40cm DSV ppm |
|---|---|---|---|---|---|---|---|---|---|---|---|---|---|
| 1 | F | F | 90° | 90° | 90° | 90° | 90° | 90° | 0° | 0° | 0° | 7,444 | 1,385 |
| 2 | F | F | 90° | 90° | 90° | 90° | 90° | 90° | 15° | 15° | 15° | 7,529 | 531 |
| 3 | F | F | 90° | 90° | F | F | 90° | 90° | 15° | 15° | 15° | 7,560 | 265 |
| 4 | F | F | 90° | 90° | F | F | 90° | 90° | 15° | F | 15° | 7,106 | 1,547 |
| 5 | F | F | 90° | 90° | F | F | 90° | 90° | 15° | A | 15° | 7,448 | 403 |
| 6 | F | F | 90° | 70° | F | F | 90° | 90° | 15° | 15° | 15° | 7,662 | 3,528 |
| 7 | F | F | 110° | 90° | F | F | 90° | 90° | 15° | 15° | 15° | 7,503 | 1,067 |
| 8 | F | F | 70° | 90° | F | F | 90° | 70° | 15° | 15° | 15° | 7,520 | 1,330 |
| 9 | F | F | 90° | 90° | F | F | 90° | 90° | 15° | 15° | 15° | 7,551 | 397 |
| 10 | F | F | 90° | 90° | F | F | 90° | 90° | 15° | 15° | 25° | 7,587 | 264 |
| 11 | 0° | F | 90° | 90° | F | F | 90° | 90° | 15° | 15° | 15° | 7,798 | 5,130 |
| 12 | F | 45° | 90° | 90° | F | F | 90° | 90° | 15° | 15° | 15° | 7,744 | 5,201 |

Legend

| | |
|---|---|
| F | Ferromagnetic material |
| A | Air or vacuum region |
| φ° | Permanent magnet with angles |

OPEN MRI MAGNETIC FIELD GENERATOR

PRIORITY CLAIM

This application claims priority from U.S. Provisional Application 60/751,450, filed Dec. 19, 2005.

BACKGROUND OF THE INVENTION

1. Field of the Invention

The invention relates to a new class of permanent magnet designs that can generate very strong and highly homogeneous fields for NMR, MRI and MRT use. In particular, the magnet is capable of generating field strengths of 1.0 Tesla or greater and still accommodate whole-body imaging without saturating the pole piece and surrounding magnet structures.

2. Description of the Related Art

In MRI the strength of the NMR signal is proportional to the magnetic field and so the greater the magnetic field the stronger the NMR signal which translates into improved image quality and faster acquisition of image data. For whole-body imaging field strengths greater than 0.5 Tesla were only achieved using superconducting coils typically in cylindrical configurations although recently there have been 1.0 Tesla open configurations as well. However, magnets based on superconducting coil technology require dual cryogen systems and periodic refilling making them expensive to buy and maintain. Consequently, a cheaper alternative is desirable.

As the overall MRI technology progresses demand for permanent magnet based MRI scanners has grown. Most whole-body permanent magnet based scanners are still below 0.5 Tesla and are limited in certain important applications that require greater field strengths. The limitations become severe when the required magnetic field is greater than 0.5 Tesla. First the available permanent magnets of which the strongest today is a Neodymium-Iron-Boron (NdFeB) compound can only produce a limited amount of magnetization—NdFeB compounds are capable of producing magnetic energy densities of up to 50 MGOe. Thus, there is a fundamental limit to how much magnetization these materials can produce and the magnets made from them if they are to be compact in size and weight. Second, the ferromagnetic structures and in particular the poles will saturate rendering the magnet inoperative.

A conventional magnet typically consists of permanent magnet blocks magnetized along the main magnet assembly axis which is cylindrical in configuration and are arranged to create a dipolar field with one section of the permanent magnets forming a North Pole and the other a South Pole. Each permanent magnet group has a yoke which are connected by returns and poles on the opposite sides that together concentrate the magnetic field in an air gap between the two poles where subjects are placed for the purposes of examination. In conjunction with actively shielded gradient coils and very high energy density permanent magnets such as NdFeB, with energy densities of 45 MGOe or greater, these systems can be optimized for energy efficiency to yield designs that can generate magnetic fields up to 0.55 T before becoming unwieldy in aspect ratio or size, weight and saturating the very important poles rendering the design inefficient, the field inhomogeneous, creating eddy current and residual magnetization problems and thermal drift issues.

The main source of the problem in conventional magnets is the poles. By design, these structures are used to create a constant potential surface across the pole-air gap interface whereby magnetic field lines emanating at this interface are perpendicular to the pole surface and create a highly homogeneous and energy efficient magnetic circuit. However, for typical whole-body systems, as the magnetic field strength in the air gap is required to be greater than about 0.4 T, the poles start to saturate making them ineffective or leading to designs that become impractical because they have to be made very thick. Physically, the poles introduce a boundary discontinuity and the magnetic field lines crossing this interface are forced to follow a path that is substantially curved away from the axial direction. At field strengths greater than 0.4 T, a significant part of the magnetic field energy gets concentrated in the poles saturating them and leading to an inefficient design. Moreover, the abrupt change of direction of magnetic field lines at the pole-air gap interface causes more magnetic energy leakage making the field in the air gap inhomogeneous along with many of the other problems already mentioned.

To overcome some of the problems posed by the poles more permanent magnets can be added to increase the magnetic field in the air gap. However, this solution leads to increased inefficiency because the yokes and returns have to be proportionally bigger in order to carry the additional fluxes generated that would otherwise lead to substantial leakage of energy through these structures as well.

In addition to the problems caused by the poles, the yoke and returns are further sources of magnetic energy leakage. In typical designs, there is a substantial flux path connecting the permanent magnets to the yoke and return. To minimize this leakage the returns can be placed further away from the air gap region. However, this increases the overall size, weight and footprint of the magnet.

Consequently, new methodologies are required to make stronger permanent magnet based designs. The canonical permanent magnet system to create a uniform dipolar field most efficiently is the spherical magnet with a vertically oriented uniform magnetization distribution on the surface of the sphere. However, this is a closed system and doesn't easily lend itself for MRI purposes because the subject under examination needs to be able to go in and out of the sphere. The next best solution is a cylindrical system that is infinite in length and has a vertically oriented uniform magnetization distribution on the surface of the cylinder. In practical implementations, the axial length and radial thickness of the cylinder is finite and instead of a continuous magnetization distribution an even and discrete distribution such as a Halbach array or a Magic cylinder is used.

Based on these efficient configurations, an open system can be formed by simply knocking out the middle portions of the magnetization blocks of the Halbach systems. Similar to conventional systems, rotating this system about the vertical axis will sweep out a circular geometry and make it very efficient. However, this system is obtained by breaking the original symmetry of the cylindrical and spherical systems. Therefore, one has to restore as much of the original symmetry to retain the full benefit of the canonical systems. In this invention, many features and variations on this theme have been used to compensate for the loss of symmetry of the Halbach type magnets and to design a system that is as efficient as possible.

Designs based on this approach far exceed current limits of conventional permanent magnet utility and have several novel features not found in previous MRI permanent magnet designs that simultaneously solve many of the drawbacks inherent in conventional designs.

SUMMARY OF THE INVENTION

Based on the above considerations, it is an object of the present invention to provide a magnet system that is suitable for generating very high magnetic fields, up to 1 T or greater, using permanent magnets for the purposes of whole-body MRI applications in an open configuration.

A main objective of this invention is that the magnet system be based on permanent magnets made up of two major sections: a disk portion and a ring portion that together generate a very strong and uniform magnetic field. The magnetization directions in the disk portion are axially oriented while in the ring portions they are substantially orthogonally oriented with respect to the disk portions.

Accordingly, such an arrangement of permanent magnet arrays has the effect of concentrating the flux generated in the center while minimizing the flux externally. A yoke system further concentrates the flux in the center and minimizes leakage while also being used to support the permanent magnets.

A further means of homogenizing the magnetic field in the center is provided by a pole that forms a constant potential surface to account for manufacturing Tolerance buildups and material inhomogenieties in the permanent magnet (PM) blocks. The pole system's effectiveness is enhanced by the drastically reduced flux generated in it due to the combination of the disk and ring portions of the PM blocks.

Another feature of this invention relates to the composition of the disk PMs that are made of multiple sections each exhibiting slightly different orientations so that flux saturation is minimized and field homogeneity in the imaging region is optimized. Moreover, a ferromagnetic portion is added midway in the disk PMs to reduce mechanical forces and increase the magnetic field in the center.

In one preferred embodiment of this invention the ring magnets are also multisectioned and their positions can be mechanically adjusted. The magnetization directions are substantially oriented in the radial direction with the lower section extending axially to form part of the shim portion of the poles. The ring magnets can be split further into two sections according to yet another embodiment of the present invention. In the upper portion the length, thickness and magnetization orientation adjusts flux distribution throughout the magnet and central field value. The lower portion adjusts saturation of the pole, particularly the Rose shims or shim rings, and field homogeneity in the air gap. Each section is separately and mechanically movable for fine tuning field strength and homogeneity.

In more particular embodiments of this invention the pole system is multisectioned. The central base section is primarily composed of a ferromagnetic material. Making the outer base section a PM material increases the central field value while at the same time reducing the overall saturation of the pole. The Rose shims can either be ferromagnetic or PM material or a combination of both. The size of the Rose shims is variable and is adjusted to optimize homogeneity and field strength.

In yet another preferred embodiment of this invention there is provided a T-section with the main yoke. In one preferred embodiment this ring section is made of a ferromagnetic material and plays the role of a field clamp significantly reducing fringe field generation. In another embodiment this ring section can be a permanent magnet material magnetized substantially in the axial direction and thereby extend the homogeneous field region in the air gap by up to 5 cm or more. The placement of the T-yoke, particularly the ring portion aids in a much more even flux distribution throughout the yoke and return yielding a more efficient yoke and return design.

In a further aspect of this invention the return portion can be placed all the way against the ring portion of the T-yoke and still maintain a highly efficient and practical design without impacting any performance parameters. Such a placement decreases the amount of flux flowing through the top portion of the T-yoke and further reduces its size and weight.

Other aspects of the invention will become clear from the drawings and detailed description to follow.

BRIEF DESCRIPTION OF THE DRAWINGS

The accompanying drawings illustrate the main aspects of the specification and together with the detailed description establish the advantages of the invention.

FIG. 2 2D, axisymmetric half-plane, finite difference magnetic field model of the magnet in FIG. 1.

FIG. 7 2D, axisymmetric half-plane, finite difference magnetic field model of the Eight-element Halbach array of FIG. 6 and the midplane vertical field profile.

FIG. 9 2D, axisymmetric half-plane, finite difference magnetic field model of FIG. 8 and the midplane vertical field profile.

FIG. 16 2D, axisymmetric half-plane, finite difference magnetic field model of the basic magnet in this invention.

FIG. 17 3D, octant model of the magnetic field produced by the disk and ring portions of the permanent magnets of this invention.

FIG. 18 2D, axisymmetric half-plane, finite difference magnetic field model of FIG. 17 with yokes and poles added.

FIG. 19 2D, axisymmetric half-plane, finite difference magnetic field model of FIG. 18 when the return posts are moved next to the ring section of the yoke in this invention.

FIG. 20 3D, octant model of the magnetic field produced by splitting the ring portion of the permanent magnets of this invention.

FIG. 21 2D, axisymmetric half-plane, finite difference magnetic field model of FIG. 15 for the consideration of analyzing the many configurations and embodiments possible in this invention.

FIG. 22 Table showing the analysis of the different configurations and embodiments in FIG. 21.

DETAILED DESCRIPTION OF THE PREFERRED EMBODIMENT

Figure 1:
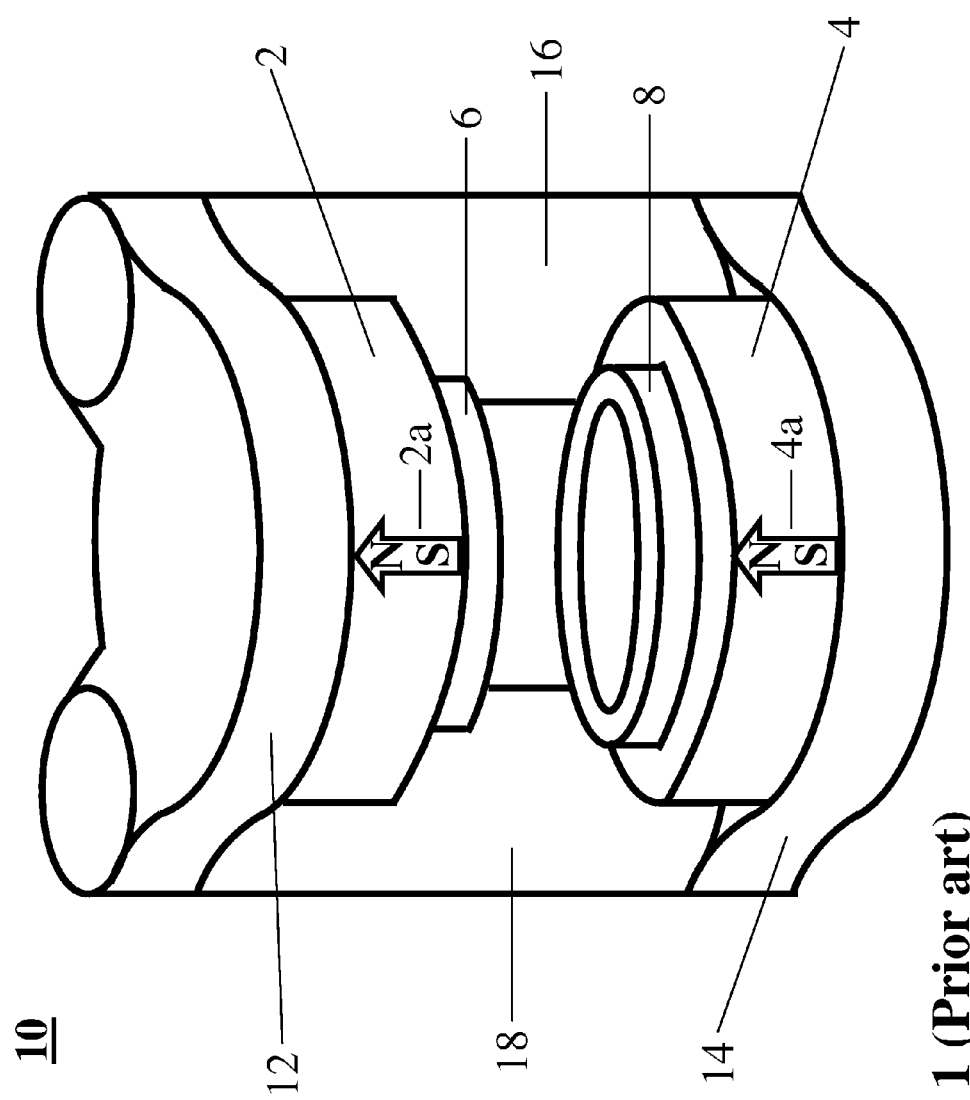
FIG. 1 A conventional C-shaped, double return, permanent magnet based MRI magnet.

System 10 of FIG. 1 is a typical open MRI permanent magnet. It consists of permanent magnet (PM) blocks 2 and 4. They are each magnetized in the same direction and are disk-like in configuration. The magnetizations are vertically or axially oriented as depicted by 2a and 4a. The PM blocks are attached to ferromagnetic yokes 12 and 14 which are connected to each other by the ferromagnetic returns 16 and 18 to form a closed magnetic circuit. The air gap between the PM blocks 2 and 4 accommodates patients for the purposes of examination. To achieve the requisite homogeneity poles 6 and 8 are attached to the PM blocks 2 and 4 respectively.

Figure 2:
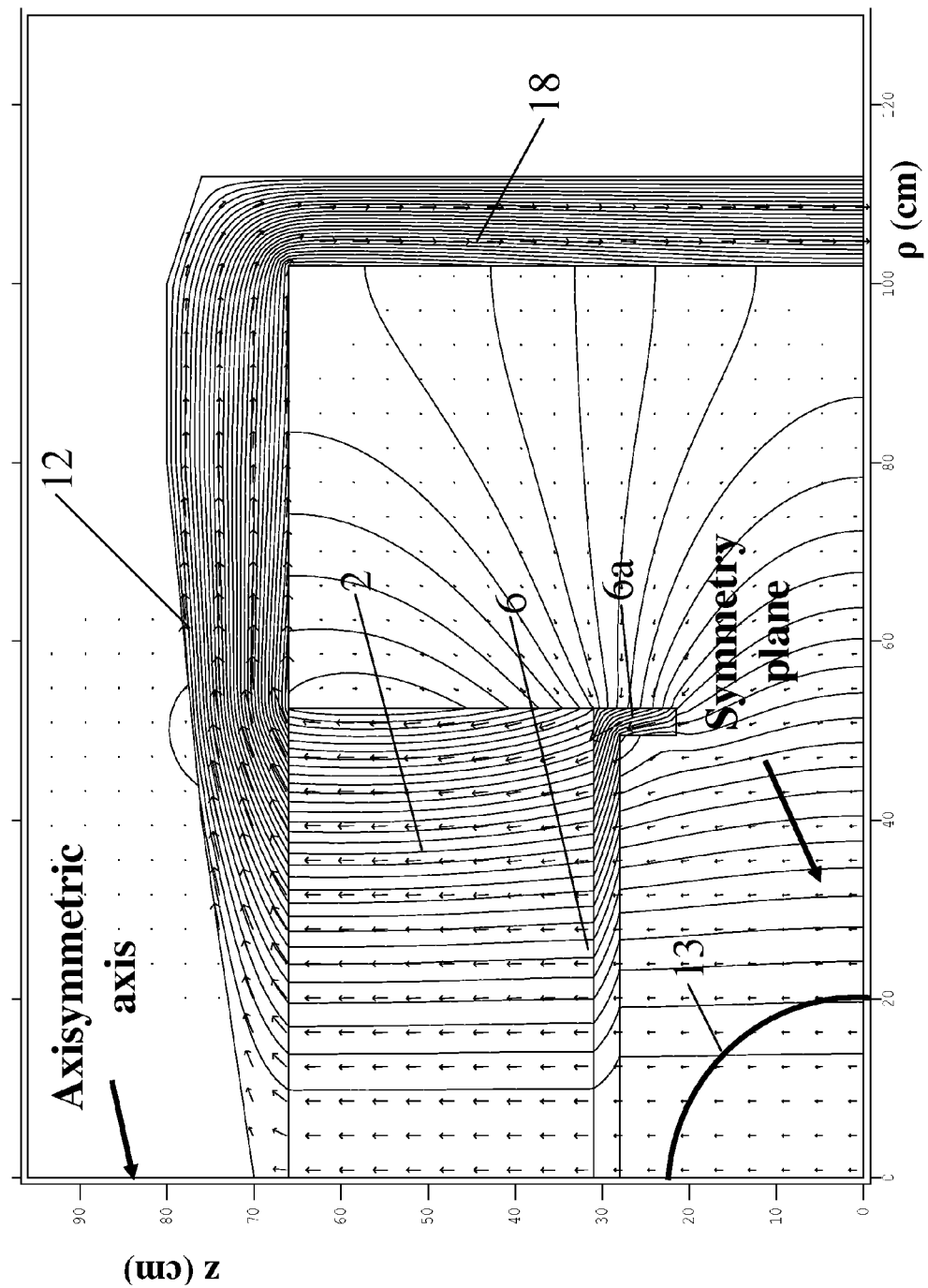

FIG. 2 shows a 2D, axisymmetric half-plane, finite difference field model of system 10. The dimensions have been optimized to yield a central field of 4500 Gauss (G) and homogeneity of 2,000 parts-per-million (ppm) on a 40 cm diameter-spherical-volume (DSV) centered on the coordinates (0,0) of the model. The DSV is shown as 13. For the PM blocks 2 and 4 a 47 MGOe energy Neodymium-Iron-Boron (NdFeB) material was used. In the model the returns 16 and 18 are actually one piece because it is a 2D axisymmetric model. However, as those skilled in the art of magnet design will recognize, a 2D model of the type in FIG. 2 is an integral part of 3D magnet design and the effects are negligible for the purposes of the description that follows. Although this is a very good performance magnet the poles 6 and 8 are saturated, particularly the shim ring portions 6a and 8a. This can be seen from an increased concentration of flux lines in the shim rings 6a and 8a and the poles 6 and 8 where they join the base portion. The poles consist of typical high-grade low-carbon steel such as 1006 steel. These materials start to saturate at about 1.6 Tesla or 16,000 Gauss. The poles in this example have fields that exceed this limit and reach as high as 2.3 Tesla.

To increase the field more PMs can be added but the poles will progressively get more and more saturated. This leads to other problems. The inhomogeneity in 13 gets worse, the magnet becomes more sensitive to thermal drifts because the saturated poles 6a and 8a leak more flux. Eddy current and residual magnetization problems are also more severe because the materials that are used to suppress them are rendered inoperative when they are saturated. In addition, flux leakage from the yokes and returns is increased.

In this invention, a fundamentally different approach is taken to address these issues and produce a magnet that is free from these problems and yet be capable of producing central fields of one Tesla or greater in whole-body magnet geometries. Starting from first principles, a magnet system is developed that is highly efficient and also suitable for open MRI type magnet applications.

Figure 3:
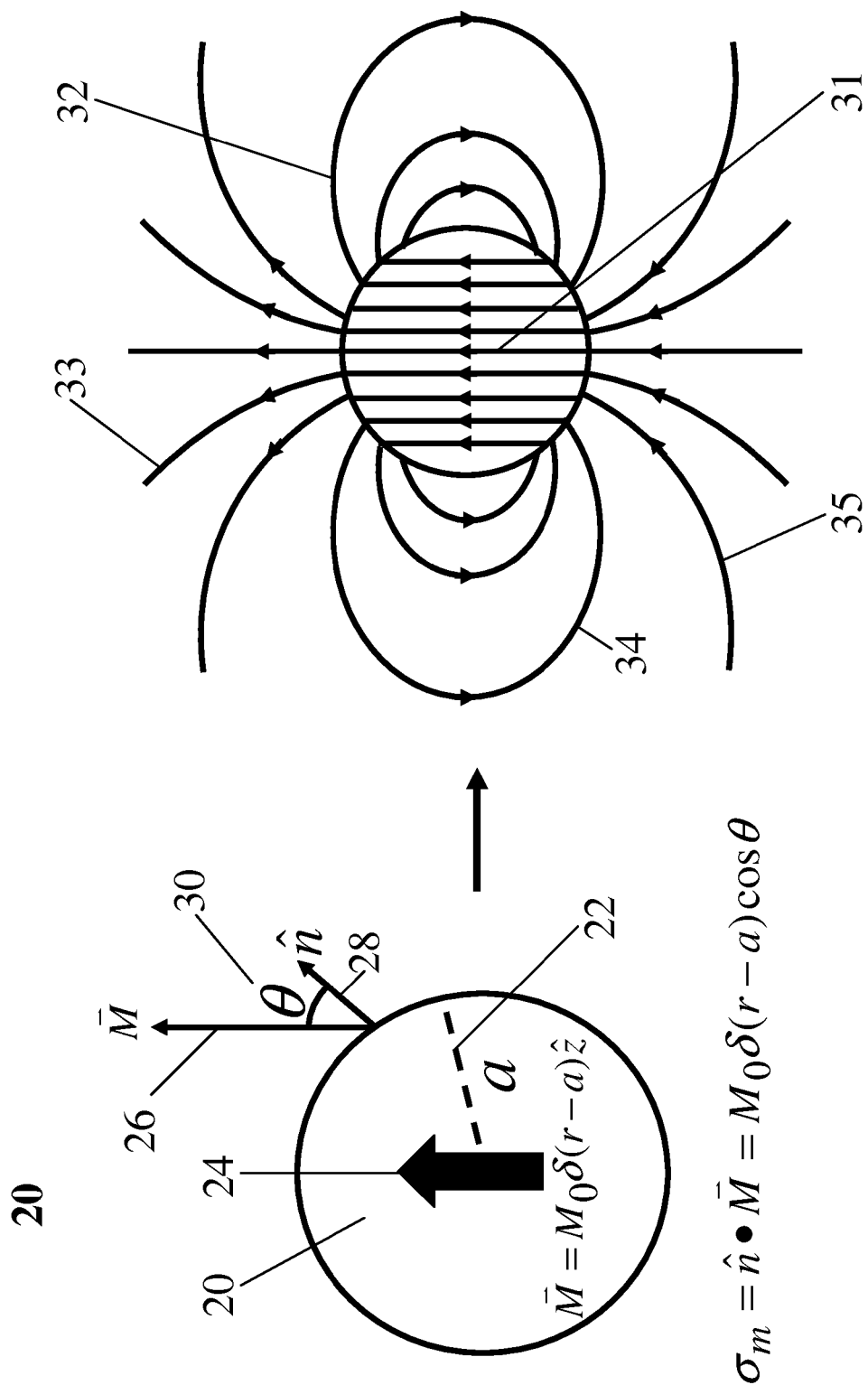
FIG. 3 Illustrates the magnetic field generated by a uniformly magnetized solid sphere.

System 20 of FIG. 3 is the canonical example of a magnetized object. It is comprised of sphere 20 with radius a, 22 and has a uniform, vertically oriented magnetization $M_0$, 24. Being a uniformly magnetized sphere it is the simplest example because the sphere is the simplest and most efficient geometry. Moreover, this example has a well known closed form analytical solution which produces a uniform magnetic field inside the sphere. Therefore, it is a very important example to consider and is the starting point for many permanent magnet designs.

The solution proceeds by solving first for the magnetic scalar potential and then calculating the magnetic field from it. Since the magnetization is uniform the effective magnetic charge density inside the sphere contributes zero potential ($\rho_M = \nabla \cdot \overline{M} = 0$) while on the surface it is $\sigma_M = \hat{n} \cdot \overline{M} = M_0 \delta(r-a)\cos\theta$ because the magnetization 26 and the unit normal to the surface 28 make an angle $\theta$, 30 with respect to each other as shown in FIG. 3. The form of this expression implies azimuthal symmetry about the vertical axis and solving Laplace's equation for this charge distribution yields the very well known result $$\phi_M(\vec{r}) = \frac{M_0 a^2}{4\pi} \int d\Omega' \frac{\cos\theta'}{|\vec{r}-\vec{r}'|} = \begin{cases} \frac{M_0}{3} r\cos\theta = \frac{M_0}{3} z; & r<a \\ \frac{M_0 a^3}{3} \frac{\cos\theta}{r^2}; & r \geq a \end{cases}$$

The field can now be calculated using $\overline{H} = -\nabla \phi_M(\vec{r})$. Inside the sphere this gives a constant field 31 whereas externally the field is equivalent to that of a point dipole source as indicated by some of the flux lines 32, 33, 34 and 35. In summary, the key feature that yielded this result is a uniform magnetization distribution that exhibited a sinusoidal variation on the surface of a closed sphere.

Figure 4:
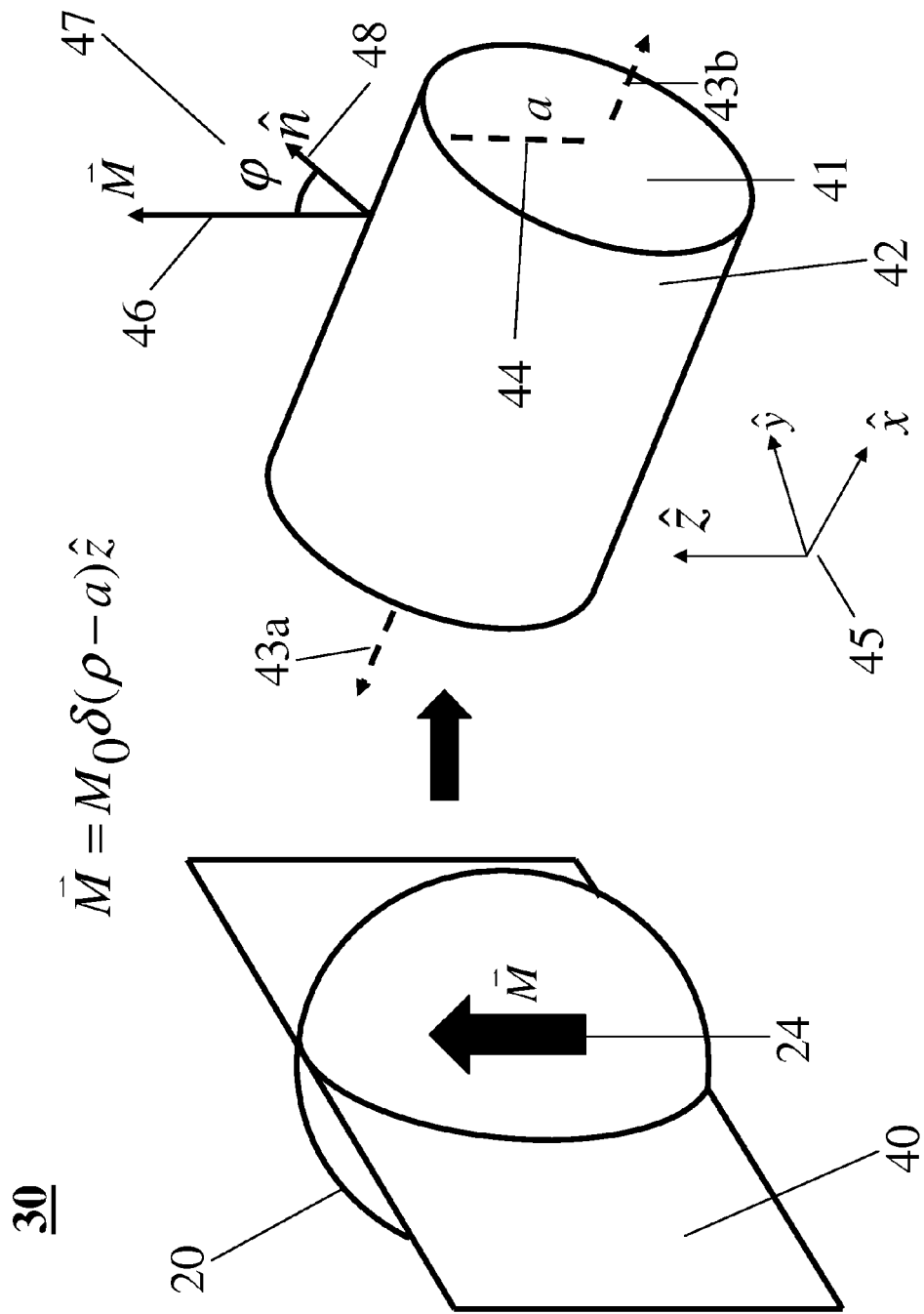
FIG. 4 A uniformly magnetized solid cylinder obtained by cutting the uniformly magnetized sphere with a plane parallel to the magnetization direction and extruding it in opposite directions.

Based on this teaching, the next natural example to consider is that of a solid cylinder which is infinite in extent as depicted in FIG. 4. System 30 can be obtained from system 20 by cutting a plane 40 that is parallel to the magnetization axis across sphere 20 and then extruding it infinitely in the two axial directions 43a and 43b. The solid cylinder 42 with radius a, 44 so obtained will again have a uniform magnetization M, 46 throughout that is vertically oriented making an angle $\phi$, 47 to the unit normal 48 on the surface.

To calculate the field we proceed as before and first find the magnetic scalar potential. The only part that contributes is the surface magnetization distribution which is given by $\sigma_M = \hat{n} \cdot \overline{M} = M_0 \cos\phi$ in cylindrical coordinates. The potential is then $$\phi_M(\vec{r}) = \frac{M_0 a}{4\pi} \int \frac{\cos\theta'}{|\vec{r}-\vec{r}'|} d\varphi' dz' = \begin{cases} \frac{M_0}{2}\rho\cos\varphi = \frac{M_0}{2}x; & \rho<a \\ \frac{M_0 a^2}{2} \frac{\cos\varphi}{\rho}; & \rho \geq a \end{cases}$$

The internal field is once again constant since the potential is linear. Compared to the spherical example the infinite solid cylinder yields a similar result in that the critical feature was a sinusoidal magnetization distribution on the surface of the cylinder, just like the sphere, that yields a constant internal field and an external field that is dipolar in nature.

Figure 5:
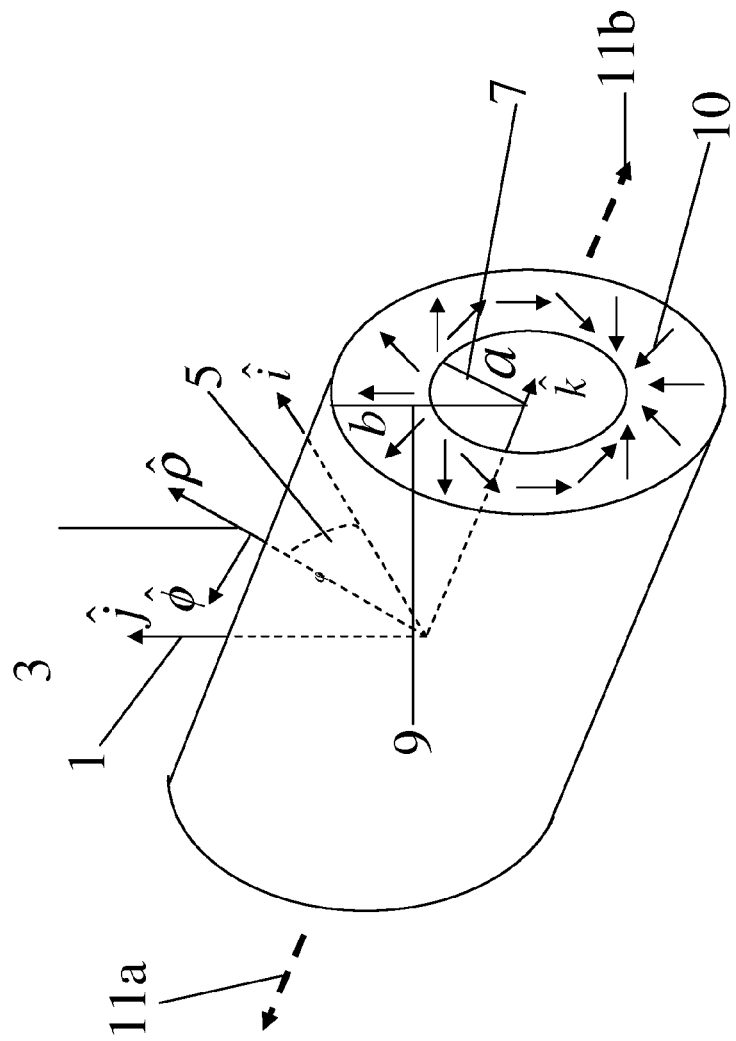
FIG. 5 Infinitely long uniformly magnetized hollow cylinder.

This naturally leads to the Halbach cylinder which is depicted in FIG. 5 as system 40. It is a hollow, solid cylinder of inner radius a, 7 and outer radius b, 9 that extends infinitely in the axial directions 11a and 11b. In this example instead of a uniform magnetization a continuously changing magnetization, 10 that exhibits a sinusoidal variation is impressed in the material between the inner and outer radii 7 and 9. It is given by $$\overline{M} = M_0[\sin(2\phi)\hat{i} - \cos(2\phi)\hat{j}]$$

in Cartesian coordinates, 1 and $$\overline{M} = M_0[\sin\phi\hat{\rho} - \cos\phi\hat{\phi}]$$

in cylindrical coordinates, 3. Such a distribution is motivated by the previous two solutions noting that the sinusoidal distribution on the surface of the material was the key feature. Additionally, as will be seen in the solution that follows a finite thickness surface adds the feature of making these systems extremely efficient because the entire field generated is internal with minimal fields externally.

In system 40 the potential has contributions both from inside the material and the surfaces. The effective magnetic charge distribution in the solid portion of the cylinder is $$\rho_M = \vec{\nabla} \cdot \vec{M} = 2M_0 \frac{1}{\rho}\sin\varphi$$

while the effective surface charge density is $$\sigma_M = \hat{n} \cdot \vec{M} \equiv \hat{\rho} \cdot \vec{M} = \begin{cases} -M_0\sin\varphi; & \rho < a \\ M_0\sin\varphi; & \rho \geq b \end{cases}$$

The solutions for these distributions are well know and the potential from the volume portion contributes $$\phi_M(\vec{r}) = \begin{cases} M_0\ln\left(\frac{b}{a}\right)\rho\sin\varphi = M_0\ln\left(\frac{b}{a}\right)y; & \rho < a \\ \frac{M_0}{2}\left[\frac{b^2-a^2}{\rho}\right]\sin\varphi; & \rho \geq b \end{cases}$$

The potential from the surface portion is $$\phi_M(\vec{r}) = \begin{cases} 0; & \rho < a \\ \frac{M_0(a^2-b^2)}{2}\frac{\sin\varphi}{\rho}; & \rho \geq b \end{cases}$$

Combining these together, the total solution is $$\phi_M(\vec{r}) = \begin{cases} M_0\ln\left(\frac{b}{a}\right)y; & \rho < a \\ 0; & \rho \geq b \end{cases}$$

Remarkably, this ideal solution predicts that for system 40 as described above and as depicted in FIG. 5, the internal field is uniform while the external field is zero. Consequently, this example implies that a continuously changing magnetization, one that is particularly sinusoidal in nature is the key to generating efficient uniform dipolar magnetic fields internally with minimal fields externally.

Figure 6:
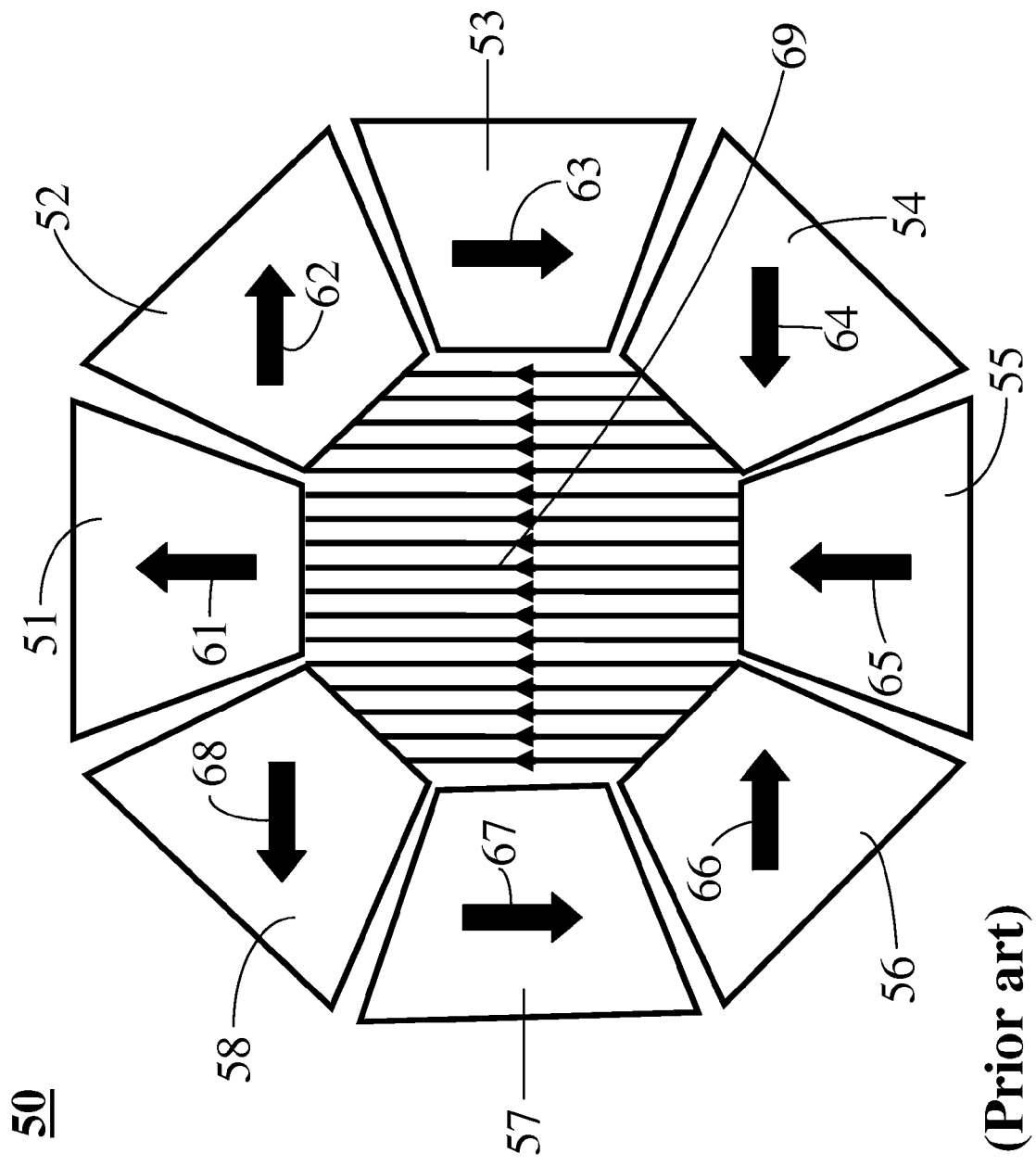
FIG. 6 An axial cross-sectional view of an Eight-element Halbach array.

Although, the Halbach cylinder is an idealized example, a more practical implementation is the Halbach array which is depicted pictorially in FIG. 6 as system 50. Instead of a continuously changing magnetization these systems are typically made of eight or sixteen discrete elements. System 50 is an eight-element Halbach array and extends infinitely along the axis. It is comprised of array elements 51 through 58. Each element has a magnetization direction given by orientations 61 through 68. These orientations differ from each other by 90° between any two adjacent elements. As FIG. 6 pictorially depicts a uniform dipolar field, 69 is generated internally with minimal fields externally.

Figure 7B:
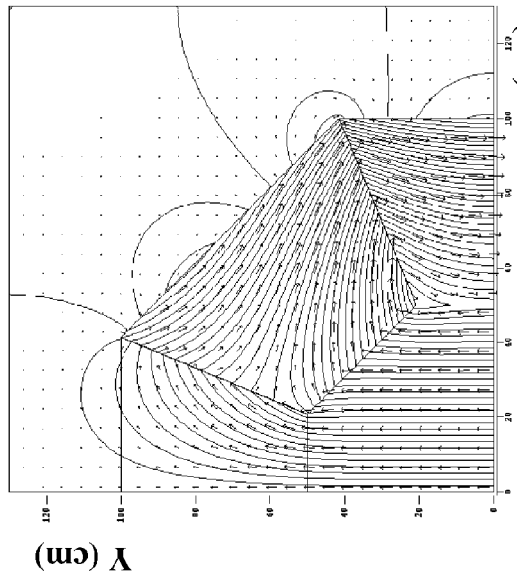
Figure 7C:
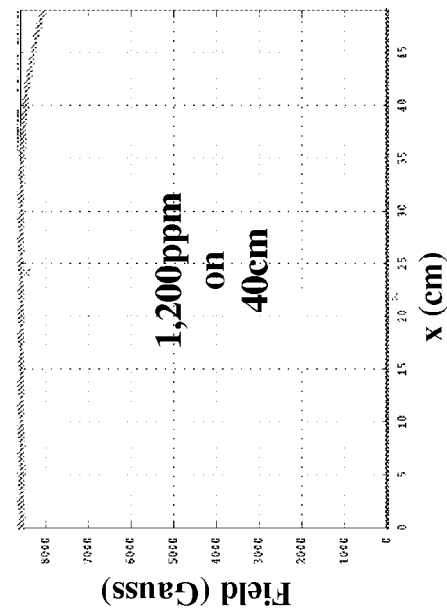
Figure 7A:
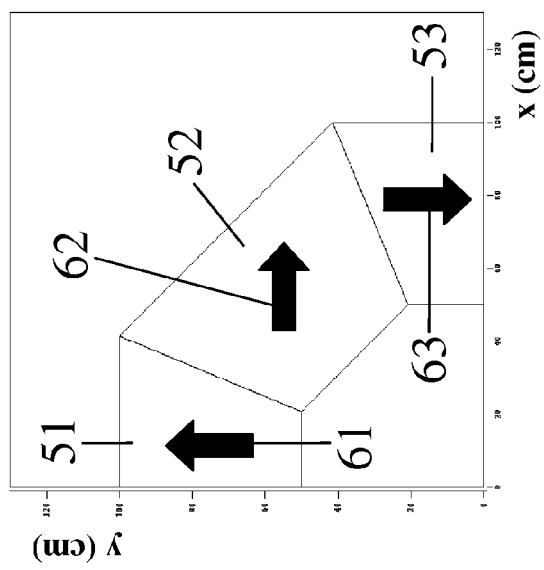

A finite-difference model for system 50 is shown in FIG. 7. It is a quarter-model as shown in FIG. 7a and the dimensions can be seen from the graphs. The internal opening is about 100 cm while the dimensions of the array elements 51-58 are about 50 cm on a side. Here only elements 51-53 are shown with only the symmetric half portions of 51 and 53 modeled. For the magnet a 47 MGOe energy NdFeB material was used. FIG. 7b shows the field profile for the model with FIG. 7c showing the vertical (By) component of the field plotted along the x-axis at y=0. The field is very constant with a value of about 8500 G and a spherical harmonic decomposition on a 40 cm DSV centered on (0,0) yields 1200 ppm on this volume.

Figure 8:
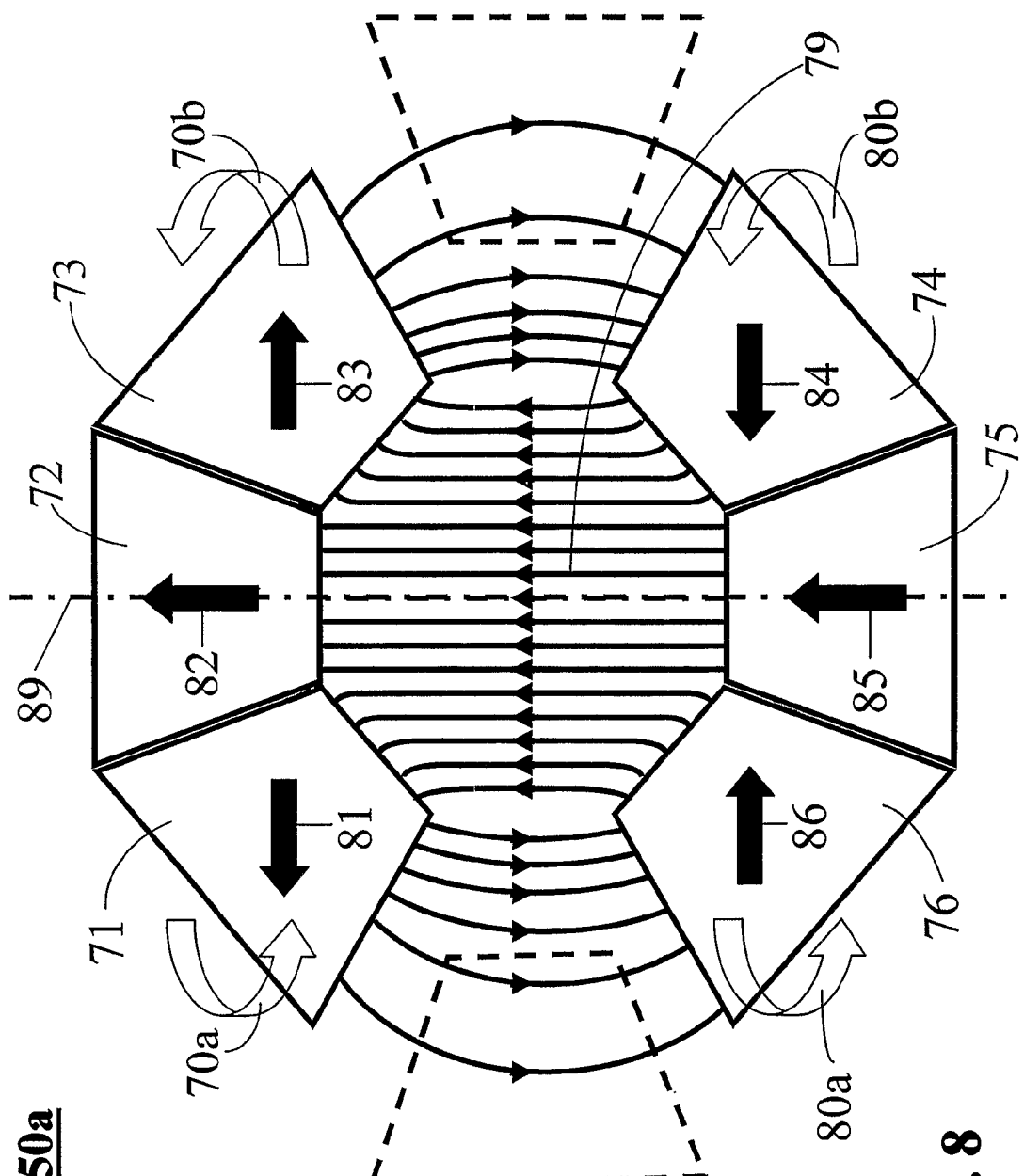
FIG. 8 The Halbach array of FIG. 6 with the middle array elements eliminated.

Although the Halbach array is a crude approximation to the Halbach cylinder system 50 it still yields a very useful magnetic field performance and there are many practical applications for these systems including whole-body MRI scanners. However, system 50 is not an open configuration and by eliminating array elements 53 and 57 it can be opened. This is a key step in the invention disclosed herein. This new configuration is designated system 50a and is depicted in FIG. 8. It consists of array elements 71-76 with corresponding magnetization orientations 81-86 respectively.

In contrast to the conventional open magnets designated herein as system 10 of FIG. 1 this system has many more magnetization orientations. Orientations 82 and 85 of the new system 50a are collinear and are oriented vertically similar to orientations 2a and 4a of system 10. However, there are four more additional orientations, 81, 83, 84 and 86. These orientations actually form a quadrupolar arrangement amongst themselves. Starting with orientation 81, going around in the plane the successive orientations 83, 84 and 86 maintain an antiparallel orientation whereas opposite elements such as 81 and 84 and 83 and 86 maintain a parallel orientation with respect to each other. Orientations, 81, 83, 84 and 86 all maintain an orthogonal orientation with respect to orientations 82 and 85.

Figure 9B:
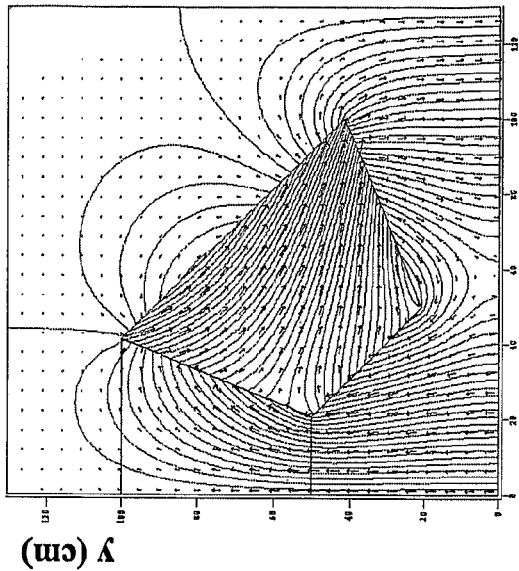
Figure 9C:
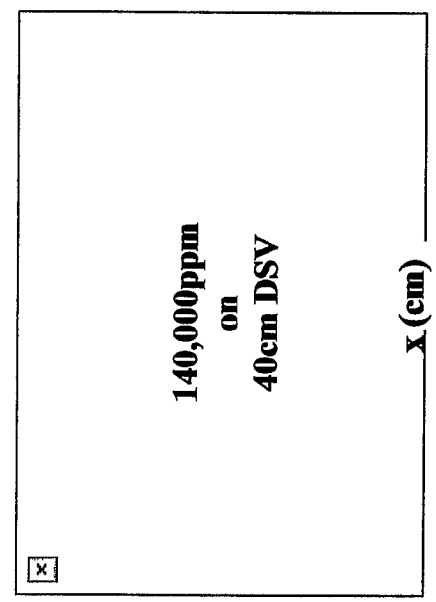
Figure 9A:
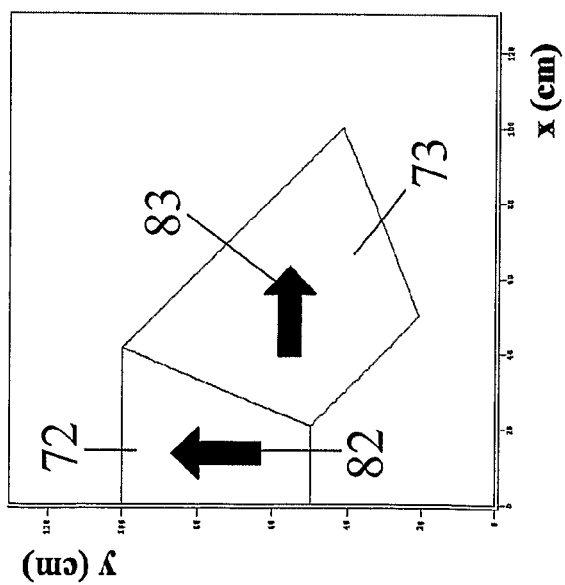

FIG. 9 depicts a finite-difference model of system 50a. It is a quarter-model showing only the symmetric half of element 72 and 73 with the corresponding orientations 82 and 83 respectively. While FIG. 9a shows the layout FIG. 9b is the actual field profile after solving the model. As can be clearly seen, there is significant field leakage where elements 53 and 57 of system 50 were eliminated. Moreover, there is considerable bending of the flux lines inside the array about position (0,0). This outward bulging of the field lines is clearly due to a severe breaking of the symmetric arrangement of the array elements of system 50. Consequently, the central field has dropped from 8500 to 5600 G. FIG. 9c shows a plot of the vertical (By) component of the field on the x-axis starting at (0,0) and ending at (50,0). It is obvious the homogeneity has deteriorated considerably and a spherical harmonic decomposition analysis yields a 140,000 ppm homogeneity on a 40 cm DSV.

Figure 10B:
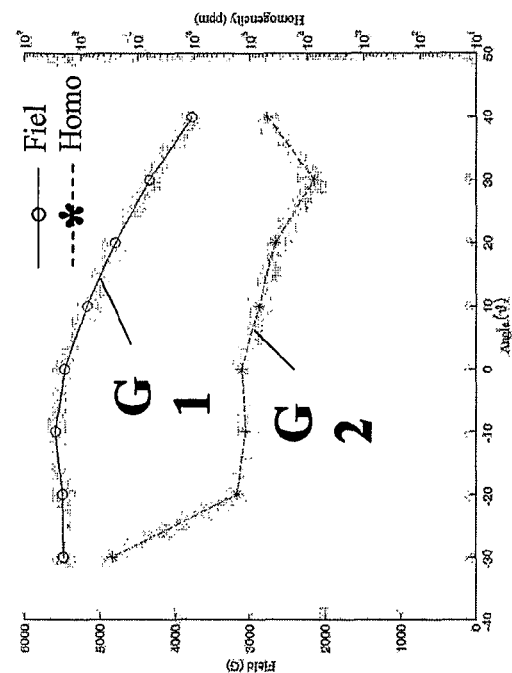
FIG. 10 The midplane vertical field profile of the model in FIG. 8 as the angular magnetization orientation of the outer array elements is varied.
Figure 10A:
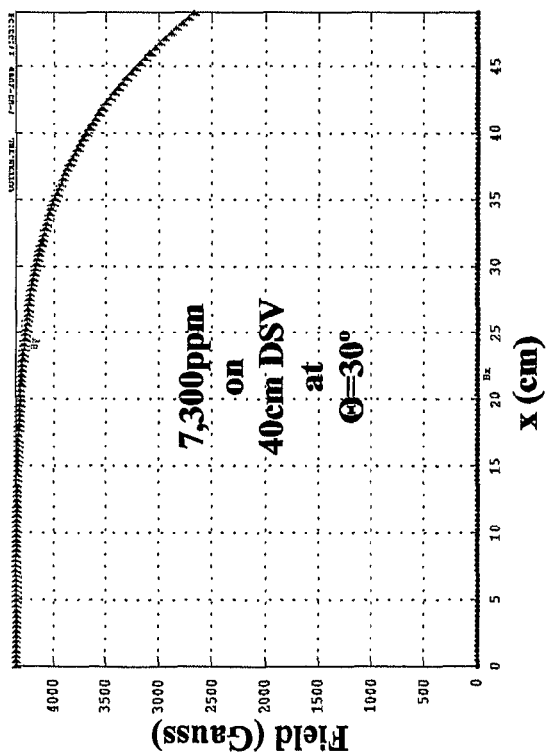

Hereinafter, the objective is to develop an open magnet system based on system 50a. Therefore, a main principle of this invention is to restore as much of the original symmetry of system 50 and thereby recover most of the loss in field strength and homogeneity of system 50a. One approach that has proven fruitful is varying the angle of the orientations 81, 83, 84 and 86. In the model of FIG. 9 this is simply achieved by just varying the orientation of 83 and by symmetry the other orientations, namely 81, 84 and 86 will have the corresponding variations as well. FIG. 10a shows a plot of the vertical (By) component of the field on the x-axis starting at (0,0) and ending at (50,0) after varying the angular orientation of 83 and it makes an angle of 30° with respect to the horizontal axis or makes an angle of 60° with respect to orientation 82. At this angle the best homogeneity is achieved as shown in the plot G2 of FIG. 10b which is a plot of homogeneity as a function of angular variation of 83. Compared to FIG. 9c much of the original homogeneity has been recovered. However, the loss in field strength, as shown by plot G1 of FIG. 10b (plot of central field value as a function of angular variation of 83), has not improved because the missing elements 53 and 57 of system 50 are necessary to restore the field to the original value in this planar configuration.

Figure 11:
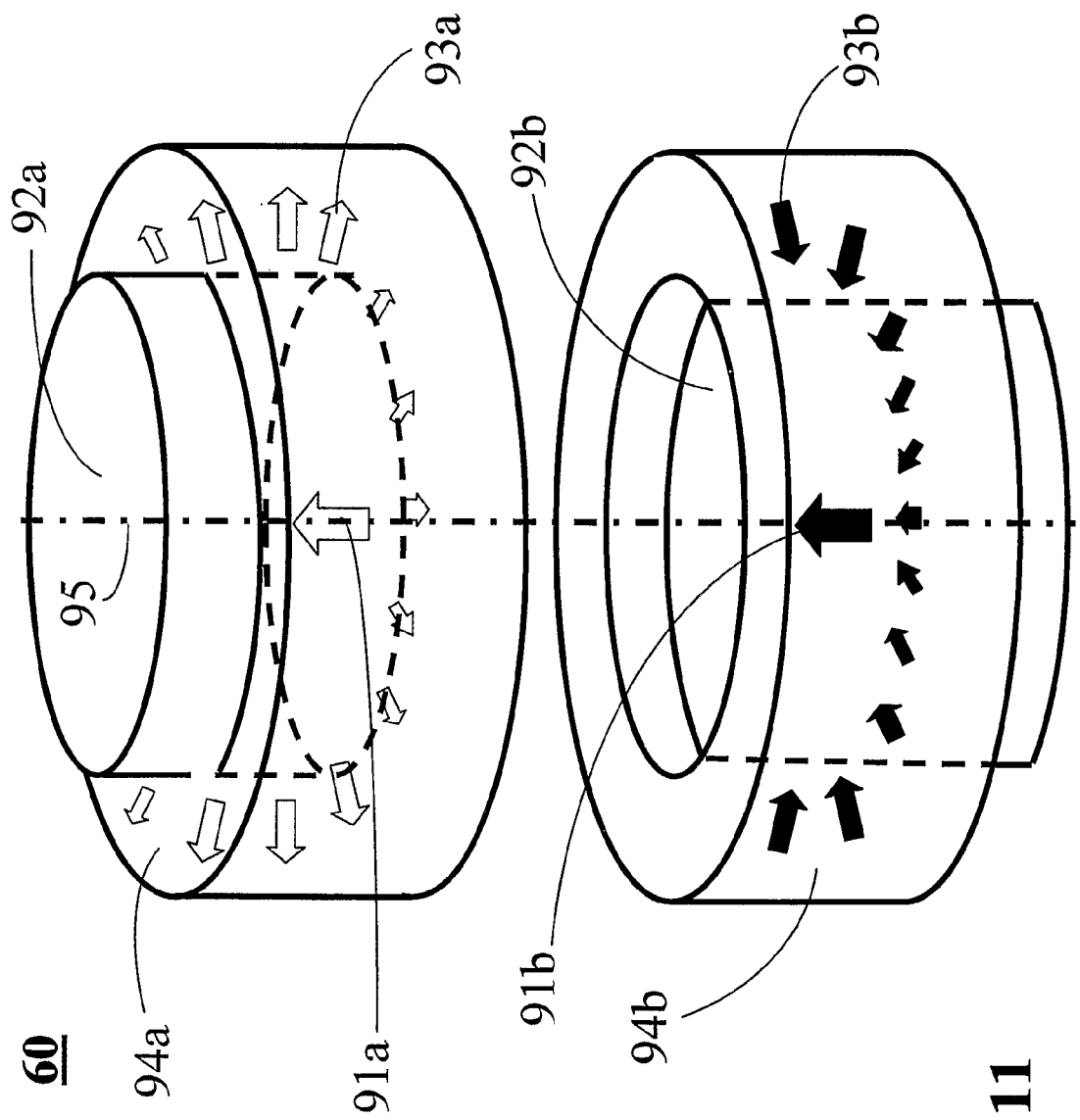
FIG. 11 A pictorial depiction of the magnet generated by rotationally sweeping the model of FIG. 8 180° about the central vertical axis.
Figure 12A:
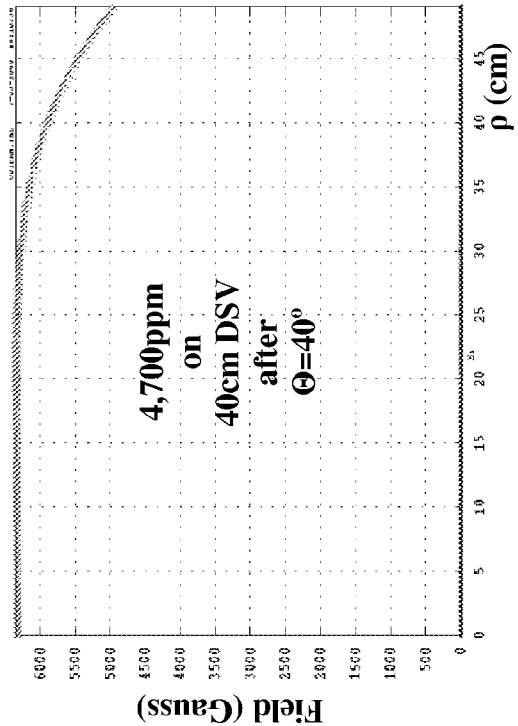
FIG. 12 The midplane vertical field profile of the model in FIG. 11 as the angular magnetization orientation of the ring magnet is varied.

Consequently, another approach is required to restore the field strength of system 50a. The approach in this invention is to make system 50a cylindrically symmetric about the axis 89 of FIG. 8 which recovers most of the loss of field strength. System 60 of FIG. 11 depicts pictorially the resulting magnet if any plane perpendicular to the axial axis of system 50a is rotated about 89 as indicated by 70a and 70b in the upper half and 80a and 80b in the lower half. The configuration so swept out would look similar to system 60. A finite-difference model of this new system is easily obtained by changing the x-axis of FIG. 9a to a radial axis and the y-axis to the vertical or z-axis and making the z-axis an axisymmetric axis. FIG. 12a shows a plot of the axial (Bz) component of the field on the radial or ρ-axis starting at (0,0) and ending at (50,0).

Figure 12B:
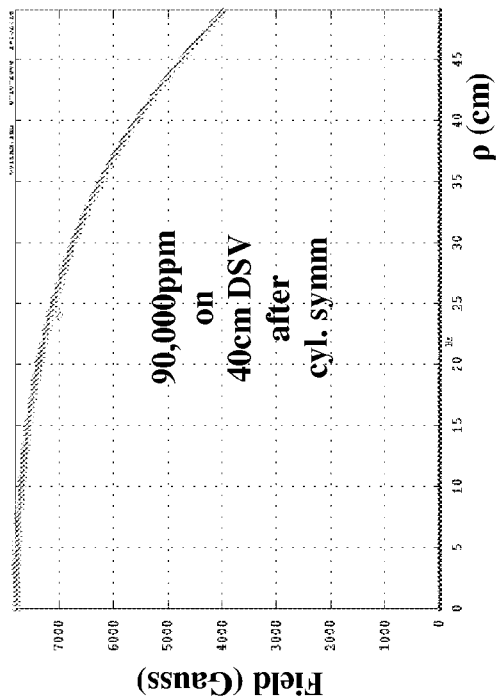
Figure 12C:
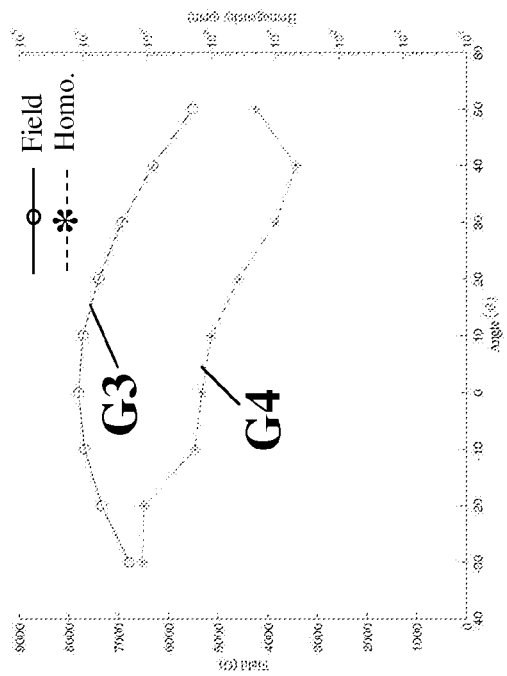

The central field is now 7800 G and is closer to the original value of 8500 G of system 50. Moreover, compared to system 50a which had an inhomogeneity of 140,000 ppm on 40 cm DSV before varying the angular orientation of 83 this new system has an improved inhomogeneity of 90,000 ppm on 40 cm DSV. Therefore, this new system is a major enhancement over 50a. Furthermore, varying the angular orientation of the radial magnetization improves the homogeneity to 4,700 ppm on 40 cm DSV when the angle with respect to the z-axis is 40° as shown by the plot of the axial (Bz) component of the field on the radial axis in FIG. 12b. Plots G3 and G4 of FIG. 12c are the field and homogeneity variations as a function of angular variation of the radial magnetization orientation.

Based on this teaching system 60 of FIG. 11 is a more practical implementation of these ideas and this invention which is a fundamentally new configuration in open MRI magnet geometries. Disks 92a and 92b are the central PM blocks with axial magnetization orientations 91a and 91b which are collinear and point in the same axial direction. PM blocks 94a and 94b are annular sections that have magnetization orientations that are substantially oriented in the radial directions where 93a is radially outward and 93b is pointing radially inward. The space between the upper and lower portions provides an opening to insert patients for the purposes of MRI examinations. It is important to note that a vertical plane that is collinear with the cylindrical axis, 95 cutting through system 60 would exhibit a sinusoidal magnetization orientation when viewing the orientations 91a, 93a, 91b and 93b going around in a circle on the plane. Therefore, the principle of a sinusoidally varying magnetization distribution is still maintained except the gap portion.

Figure 13:
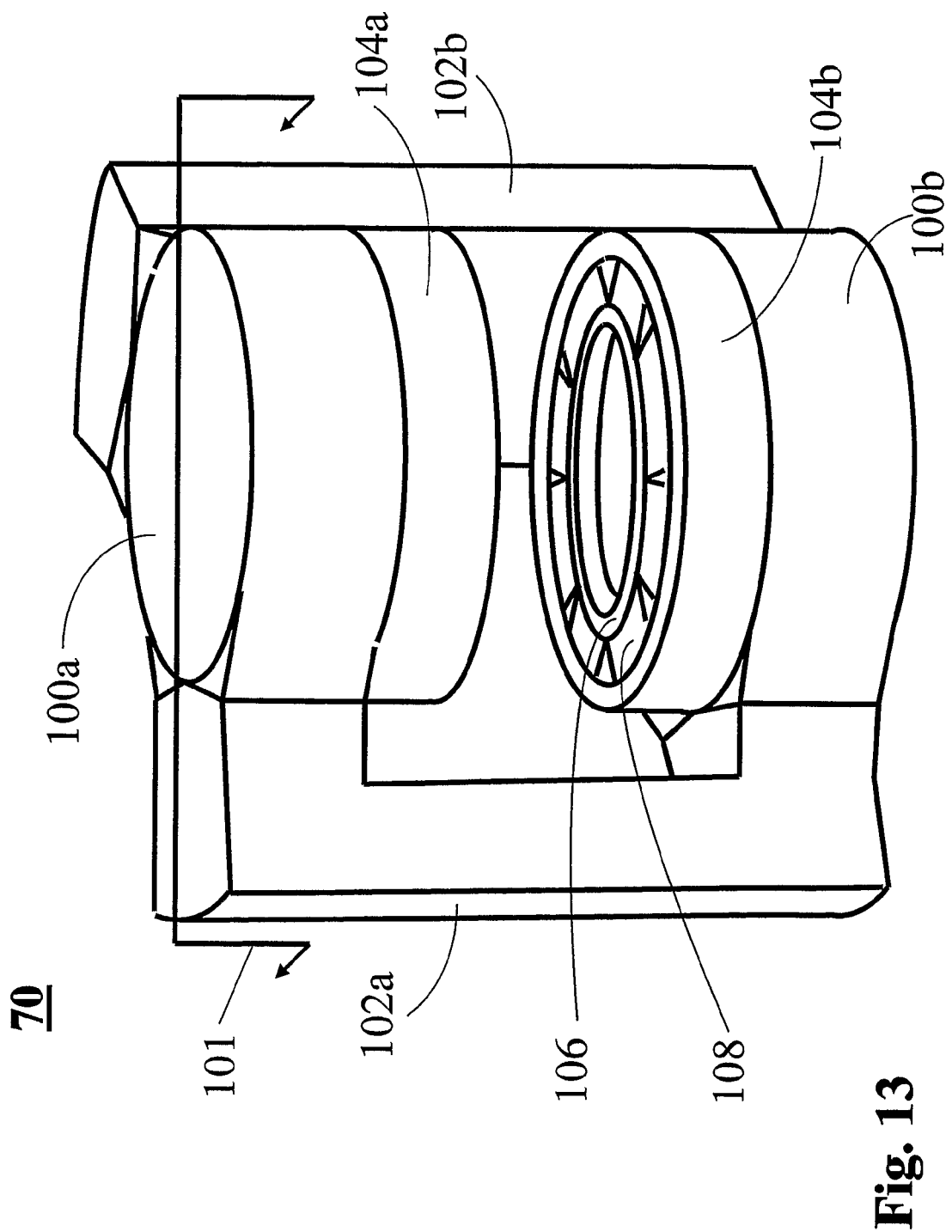
FIG. 13 A pictorial depiction of the magnet of FIG. 11 with supporting yokes, flux return posts and magnet poles.

A further enhancement of system 60 is that of system 70 shown in FIG. 13. System 70 is just system 60 but with yokes 100a and 100b added and connected to each other with returns 102a and 102b to form a closed magnetic circuit and limit the amount of fringe fields produced. Adding these structures can add between 25-50% to the central field. Further fringing fields can be contained by adding field clamps 104a and 104b to the ring sections 94a and 94b. Additionally, pole 106 has been added with a corresponding pole in the upper section not shown in FIG. 13. The poles provide a constant potential surface while the Rose shims correct the second order (dominant error) term, and together homogenize the central field.

Figure 14A:
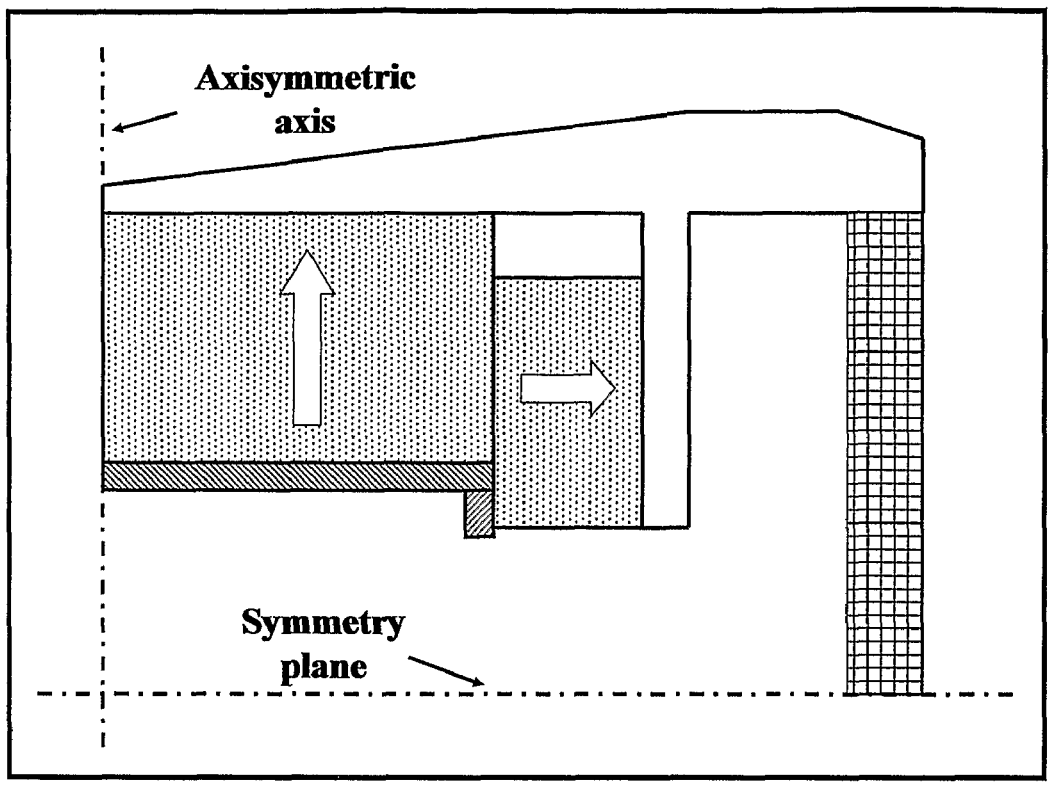
FIG. 14 Nomenclature for the new magnet circuit elements of the model in FIG. 13.
Figure 14B:
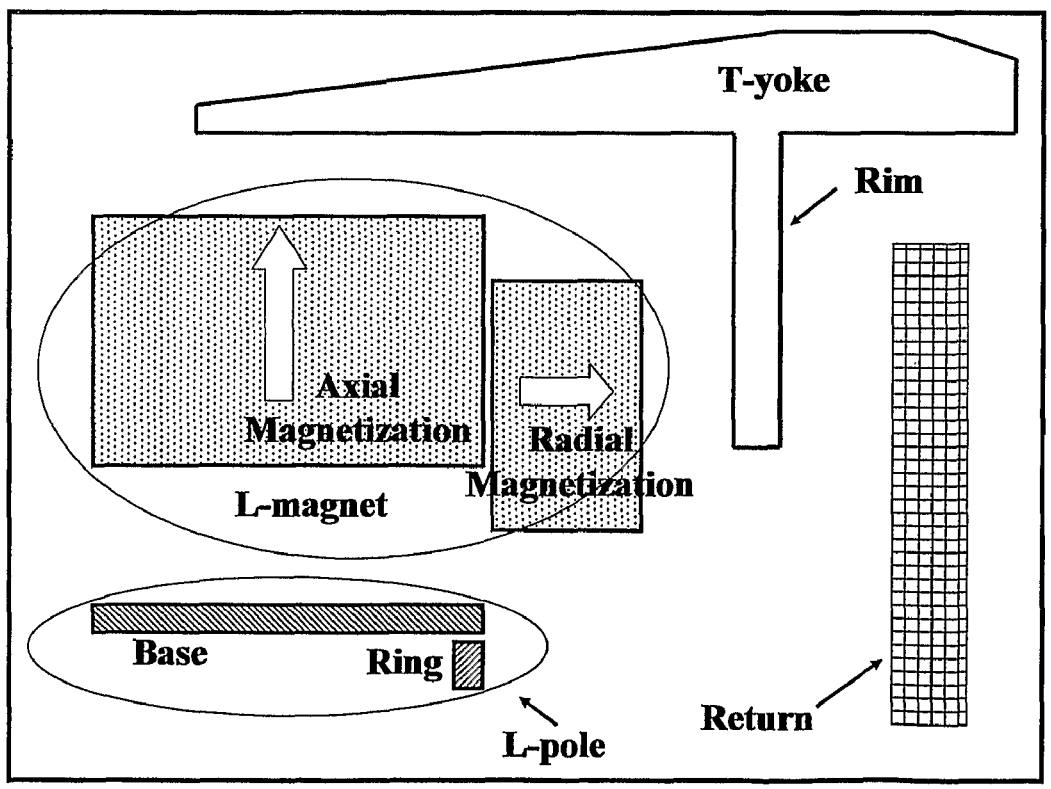

When system 70 is viewed as a 2D axisymmetric system it has many new magnet circuit elements that are quite different from the conventional system 10 of FIG. 2. Accordingly, we use the following nomenclature for these new circuit elements as shown in FIG. 14. The yoke and field clamp together we designate a T-yoke. The disk and ring PM blocks together we designate as an L-magnet and the base plate portion of the poles with the shim rings together an L-pole. A more detailed consideration of system 70 and the interplay between all the pieces to fine tune this invention is considered by looking at the view cut through by 101 of FIG. 13.

Figure 15:
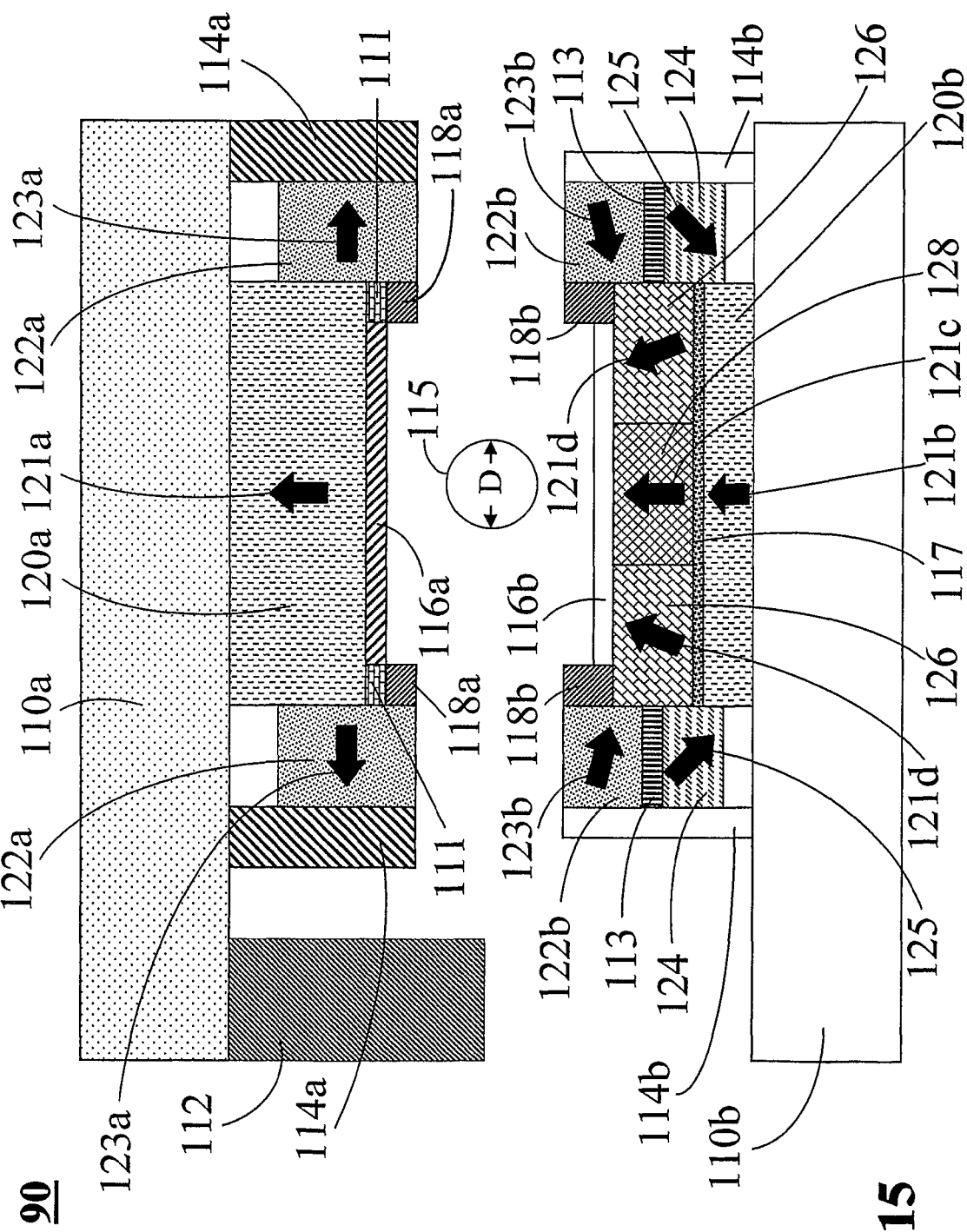
FIG. 15 A detailed cross-sectional view of the magnet in this invention with the many different configurations and embodiments.

System 90, shown in FIG. 15, is a detailed view of system 70 with the many more configurations and embodiments of this invention that enhance the magnetic performance. In one preferred embodiment of this invention an L-magnet comprised of disk portion 120a with vertical orientation 121a and ring sections 122a and 122b with corresponding radial magnetizations 123a and 123b respectively are attached to ferromagnetic T-yoke 110a and 114a. To close the magnetic circuit a ferromagnetic return, 112 connects a symmetric portion of the upper L-magnets and T-yokes on the bottom. An L-pole to homogenize the field in the air gap is formed of base plates 116a, shim rings 111 and 118a all made of ferromagnetic material. A symmetric L-pole on the lower L-magnet exists as well. In the example considered, the L-magnets are all made of 47 MGOe energy NdFeB material and the T-yokes and returns are 1010 low-carbon steel whereas the L-poles are 1006 low-carbon steel.

Figure 16:
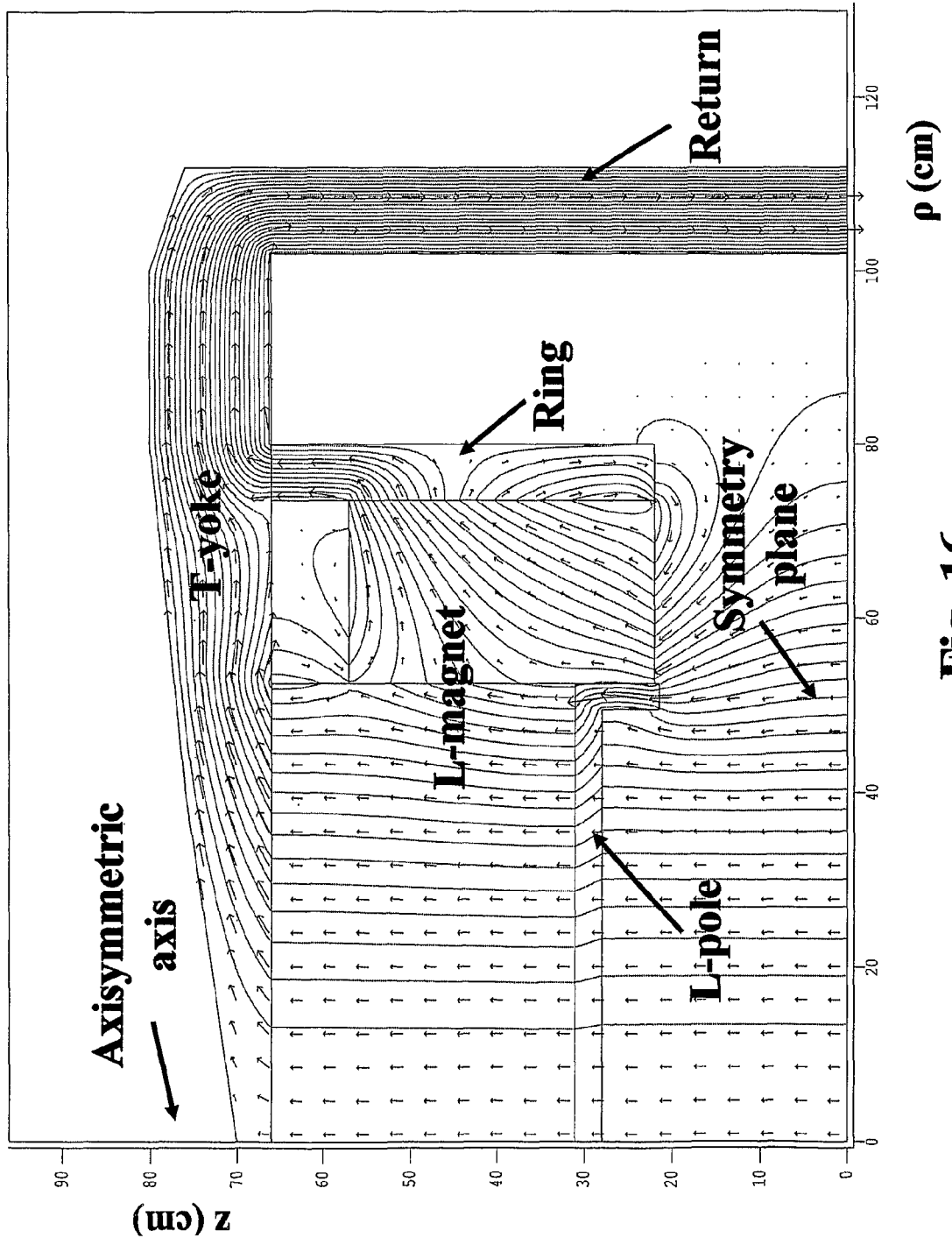

A 2D axisymmetric finite-difference model of the magnetic field generated by this system is shown in FIG. 16. A central field of 7,500 G is obtained and a close inspection of the L-poles reveals much less bunching of field lines compared to system 10 in FIG. 2 and hence no saturation. Moreover, a spherical harmonic decomposition of the field on a 40 cm DSV centered on the coordinates (0,0) reveals a homogeneity of 1257 ppm. The DSV is also depicted as 115 in FIG. 15. This performance is significantly better since in system 10 a central field of only 4,500 G was reached when the onset of saturation was initiated. Furthermore, the geometric dimensions of system 70 are not much more than system 10. Overall, the volume and weight of system 70 are only 15% more than that of system 10 for a 40% increase in field. Usually, the scaling of system dimensions with central field is nonlinear and in view of this fact the performance of the new invention is recognized as being much more efficient than conventional designs.

Figure 17B:
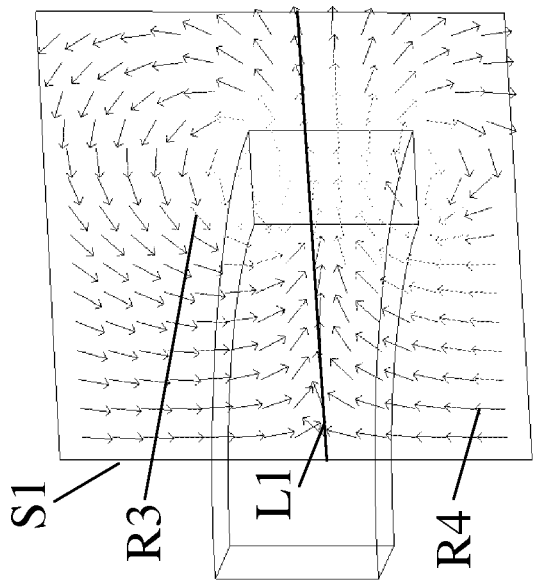
Figure 17A:
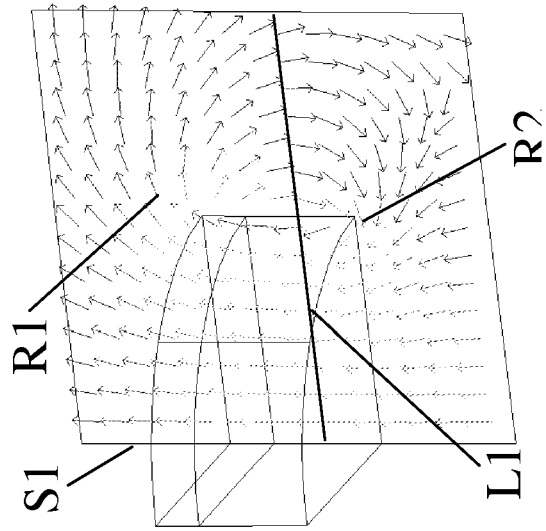
Figure 17C:
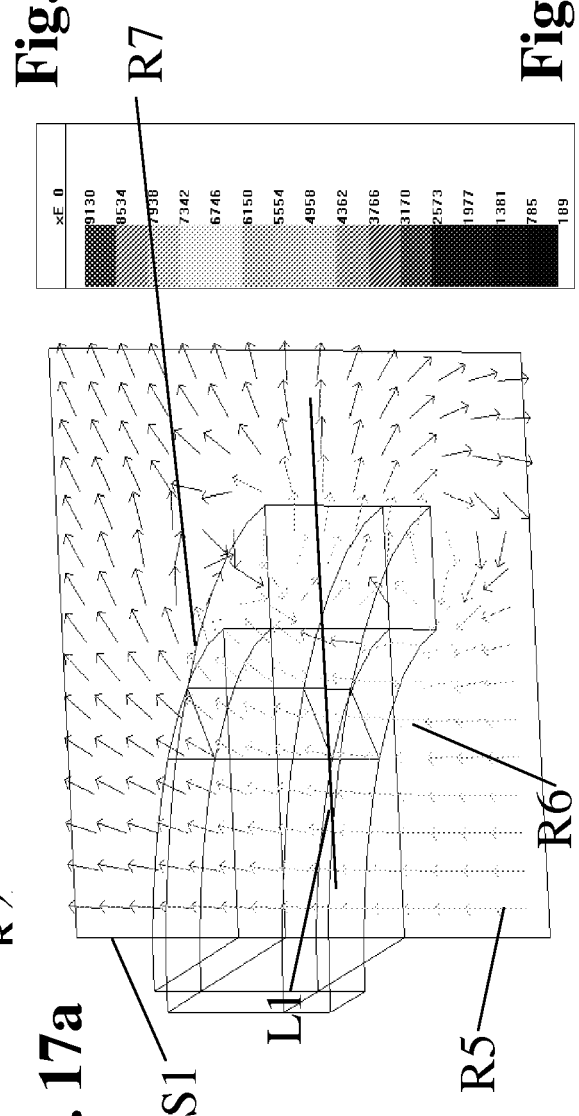

FIGS. 17a-17c show one octant of a 3D model of the magnetic field produced by the L-magnets alone when using a 47 MGOe energy NdFeB magnet material. FIG. 17a is the disk portion 110a. The field profile in the plane S1 is shown where the lower left corner is centered on (0,0,0) and the upper right corner is at (100,0,100). The disk has a radius of 52.5 cm and a height of 35 cm. It produces an average central field of 4,000 G but has homogeneity of only 170,000 ppm. The ring section 122a and 123a shown in FIG. 17b has inner and outer radii 52.5 cm and 73.5 cm respectively with a height of 35 cm. In the same plane S1 it produces an average central field of 2,000 G. A close inspection of the flux lines shows that below line L1, in region R4 the fluxes are vertically oriented in the central region and are clockwise in the outer regions whereas above line L1 the fluxes are all counterclockwise. Compared to the disk 110a where all the fluxes are clockwise the ring portions 122a and 123a add fluxes in a very efficient way. Above L1 the fluxes from 110a, 122a and 123a oppose each other and cancel. Below L1 the fluxes from 110a, 122a and 123a add. FIG. 17c depicts this when the disk and ring are added together to form the L-magnet and clearly shows where the efficiency of this invention is derived from. In the external regions R7, that is where the T-yokes and returns are placed, the fluxes are very minimal and therefore the amount of ferromagnetic material required to carry these fluxes is also lowered. However, in region R5 the fluxes add together to give an average central field of about 6,000 G with homogeneity of 14,000 ppm which is significantly better than the disk 110a of FIG. 17a. Moreover, region R6 of FIG. 17c shows a lower flux bunching compared to the same region, R2 of FIG. 17a. That is, the poles will also carry less flux because of the manner in which the ring and the disk add fluxes in this region.

The gains in efficiency obtained by adding the disk portion 110a and the ring portions 122a and 123a as shown in FIGS. 17a-17c are even more dramatic when the T-yokes and L-poles are included. FIGS. 18a-18c depict a 2D axisymmetric finite difference model of the magnetic field generated with the T-yokes and L-poles. FIG. 18a shows the magnetic field flux flows with just the disk portion Dk1. The flux lines flow in a clockwise direction through the disk, Dk1, the upper yoke, Ty1, the back section of the T-yoke, Ty3 and into the returns to the lower symmetric section of the magnet system back to the air gap, Ag1 which has the desired vertical orientation. The flux flows through the ring section, Ty2 and the L-poles, Lp1 are also in a clockwise direction. In contrast to FIG. 18a, FIG. 18b shows the flux flows with just the ring portion, Rg1. The flux flows are now in a counter clockwise direction through the upper yoke, Ty1, the region where the disk magnet would have been and into the L-poles, Lp1, the ring magnet, Rg1, and into the ring, Ty2, which when it reaches the upper yoke splits into two directions, one back towards Ty1 and the other towards the back portion of the T-yokes, Ty3 and into the returns to the lower symmetric section of the magnet system and closes the loop back through the air gap region, Ag2 which is vertically oriented. When the disk, Dk1 and ring, Rg1 are present as in FIG. 18c then the flux flows of FIGS. 18a and 18b superimpose in the desired fashion of this invention resulting in the dramatic efficiencies of the magnet system.

The central field in the air gap, Ag1 of the disk, Dk1 in FIG. 18a produced a value of about 4,600 G whereas the central field in the air gap, Ag2 of the ring, Rg1 in FIG. 18b produced a value of about 3,100 G and the total central field in the air gap, Ag3 of both Dk1 and Rg1 in FIG. 18c produced a value of about 7,600 G. Remarkably, this system produced increased field values in the air gap region Ag3 which was very desirable while at the same time decreasing the magnetic field values in all other regions. In FIG. 18c, the regions Ty1, Ty2, Rg1, Dk1 and the very important L-poles, Lp1 all had significantly reduced field values because the flux flows for these regions in FIGS. 18a and 18b were in opposite senses. For example, field values in Dk1 in FIG. 18a range from a minimum value of about 9,300 G to a maximum of about 11,500 G whereas in FIG. 18c the field value in Dk1 was fairly constant throughout at about 7,700 G. Similarly for Rg1 in FIG. 18b the field values ranged throughout this region from about 6,600 G to about 11,000 G whereas in FIG. 18c they ranged from 1,500 G to about 8,500 G with the exception of some corners approaching 10,000 G. The yoke region Ty1 in FIG. 18a was saturated with peak fields of about 20,000 G whereas in FIG. 18c it is back down mostly under 10,000 G except the back sections towards Ty3. The very important L-poles, Lp1 which were saturated with field values of up to 25,000 G throughout most of this region in FIGS. 18a and 18b are now down to 12,000 G in FIG. 18c. This is one of the most important features of this invention. Moreover, the addition of the T-yokes boosts the central field by another 1,500 G and the L-poles improve the homogeneity to well below 2,000 ppm. Further varying the magnetization orientation of the ring magnets improves the homogeneity to well below 1,000 ppm. This is considered in other embodiments of this invention.

Figure 19:
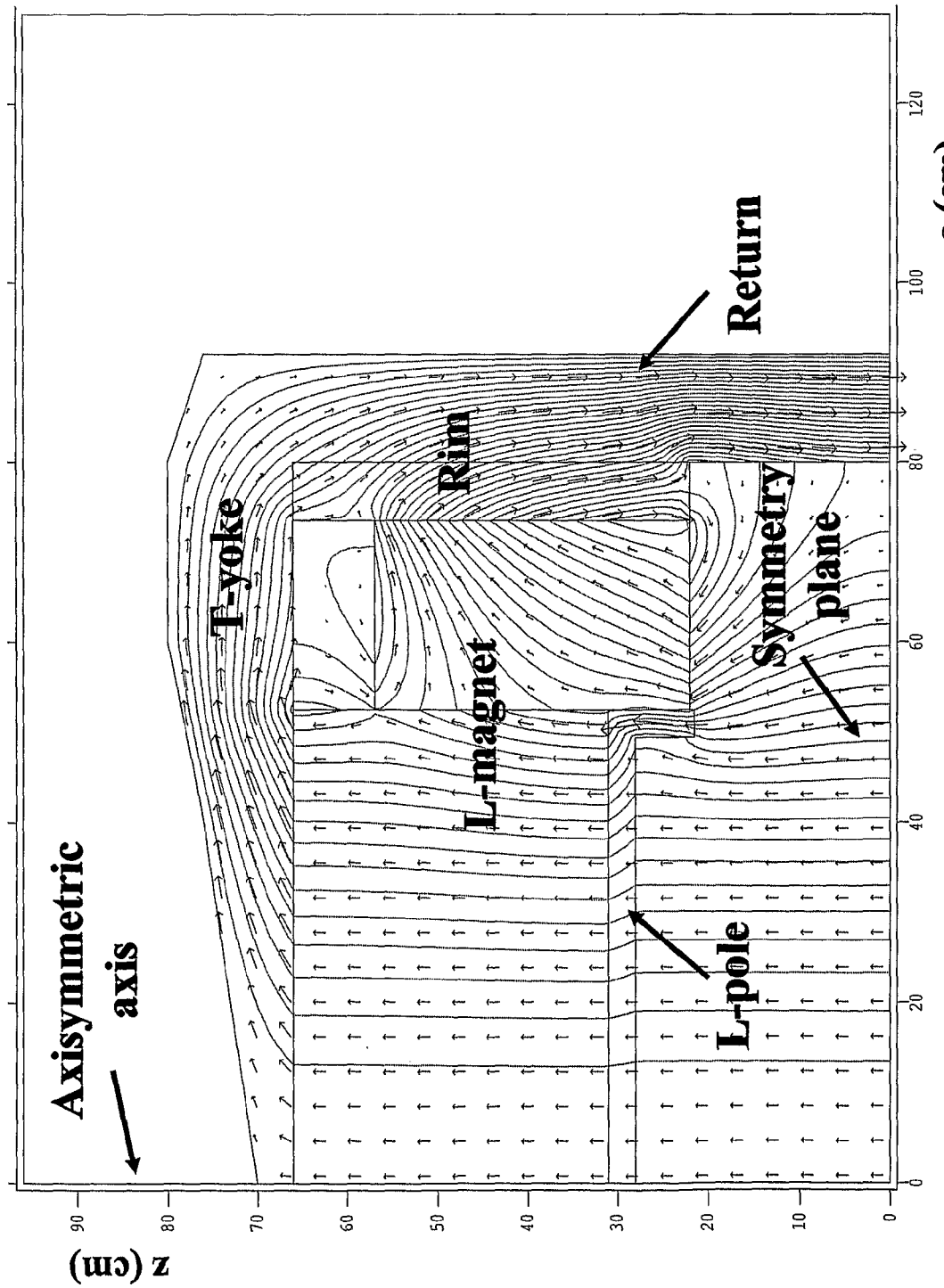

The system of FIG. 18c generates such a low fringe field that in another embodiment of this invention the returns 112 can be placed next to the T-yoke as shown in FIG. 19. In this example, the returns have been moved in by more than 20 cm and doing so has minimal effects on the central field value and homogeneity. However, the same can not be done in system 10 because the leakage field is to detrimental to the homogeneity of the central field and it can't be corrected by passive shimming techniques as is well known by those skilled in the art. Moving in the returns against the T-yokes has the benefits of a much reduced weight and volume with an overall smaller aspect ratio compared to system 10. This has the further advantage of a smaller footprint magnet that takes up less space in a hospital or clinical setting.

Moreover, some or the entire ring portion of the T-yokes can be made of PM blocks with magnetization substantially in the axial direction instead of a ferromagnetic section. With this change in the ring portion of the T-yokes the central field can be further extended radially outward enhancing the shimming and giving another degree-of-freedom in the shimming of the overall magnet.

Figure 20B:
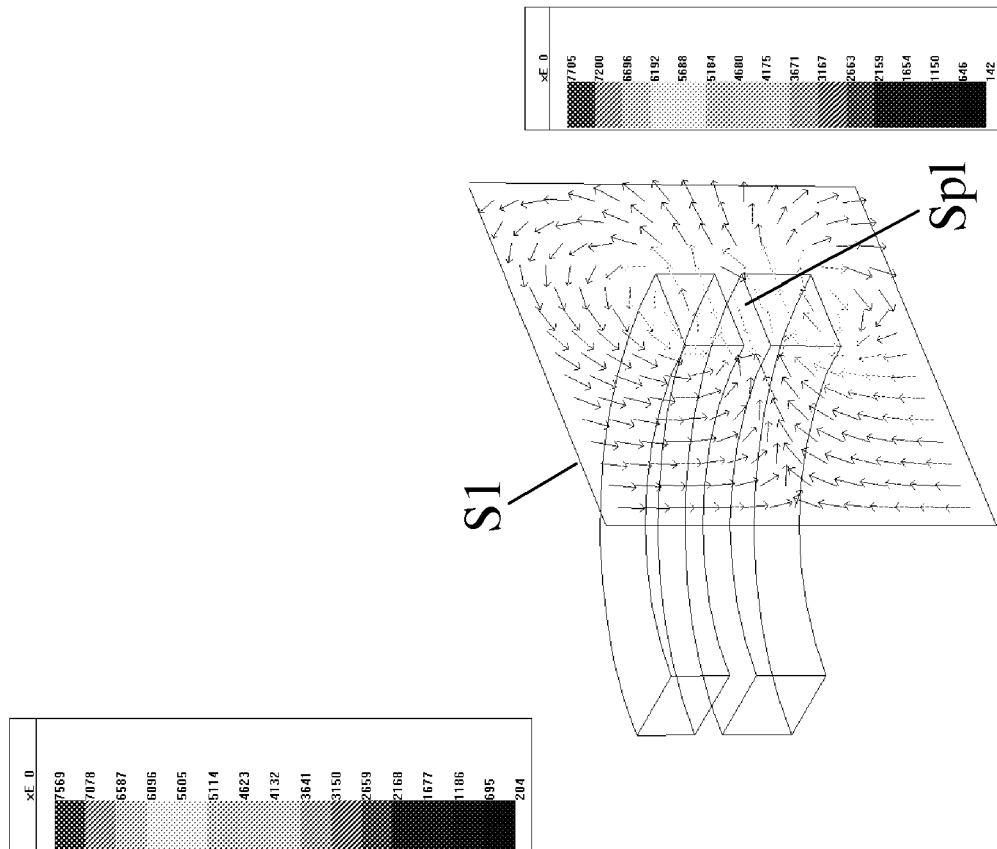
Figure 20A:
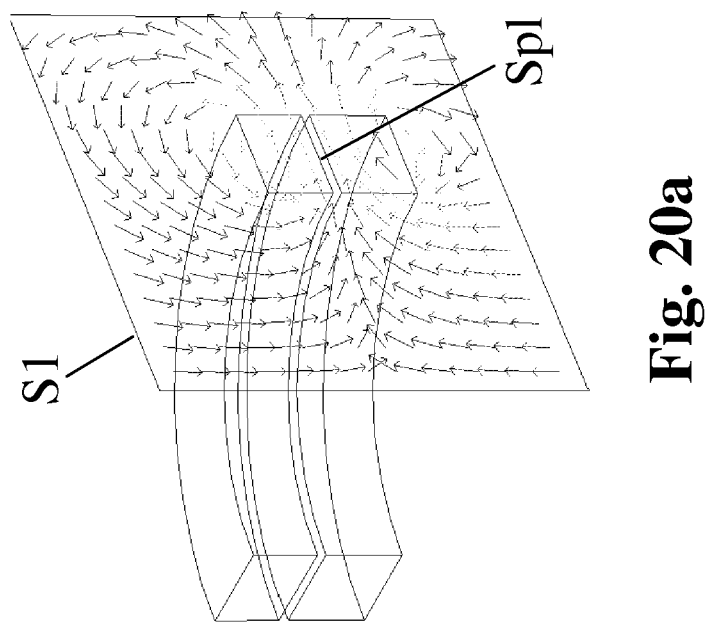

In a further embodiment of this invention, the ring magnet can be split into two or more sections. Referring to the model of the ring magnet depicted in FIG. 17b and splitting it, for example into two sections will have an effect as shown in FIG. 20a. The flux flow in region Sp1 will be altered in a way that has both an effect on the strength of the overall magnetic field produced in the air gap region and the homogeneity of that field including the saturation of the L-poles. More particularly, as shown in FIG. 20b, when the splitting is a bit more pronounced the flux flows in the region Sp1 reverse directions to the one shown in FIG. 20a which has the effects mentioned. These considerations will be analyzed in further detail below.

Figure 21:
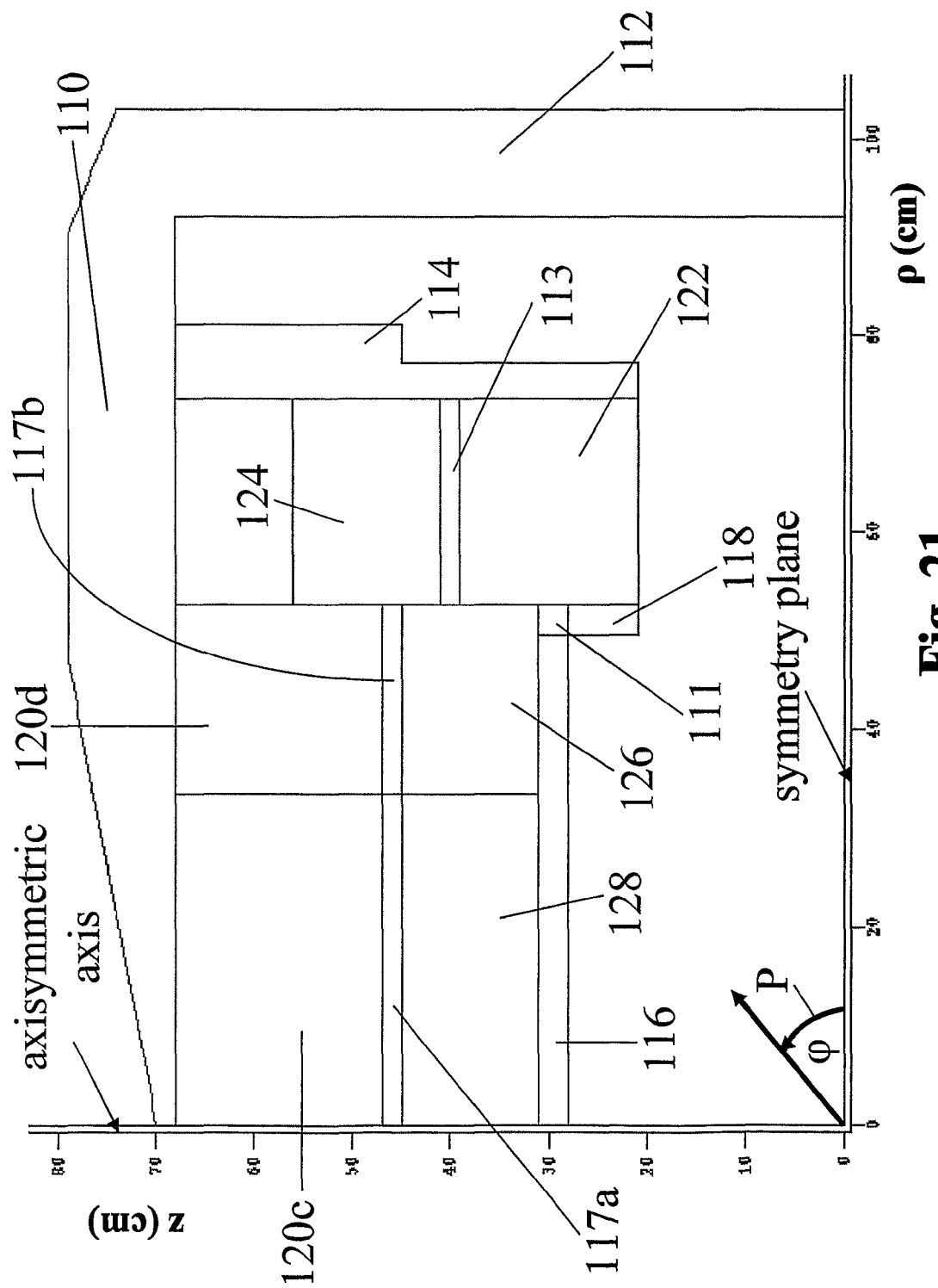

FIG. 21 is a 2D, axisymmetric finite difference magnetic field model for the consideration of analysis of the many configurations and embodiments of FIG. 15. As shown in the table of FIG. 22 the many embodiments of this invention are analyzed as case studies. In reference to FIG. 21 the table lists the particular elements and their configuration for each study with the last two columns reporting the central field value and the homogeneity, respectively. As further shown in the Legend of FIG. 22 F designates a ferromagnetic material, A an air or vacuum region and an angle represents a permanent magnet material, a 47 MGOe energy NdFeB magnet material with their angular orientations given with respect to the ρ-axis, P of FIG. 21. Case 1 is the basic magnet system of this invention with elements 111 and 118, the edges of the base plate part of the L-poles and the Rose shims, respectively, when each are ferromagnetic materials and the various parts of the disk and ring portions of the L-magnets having their magnetizations simply vertical and orthogonal, respectively. This was already analyzed in FIG. 16 producing a central field of about 7,450 G and homogeneity of about 1,400 ppm on a 40 cm DSV.

In Case 2, the ring magnet portions are all exhibiting a tilted magnetization orientation of 15° with respect to the horizontal, ρ-axis of FIG. 21. This is a very beneficial aspect of the invention as already mentioned previously adding about 100 G to the central field value and improving the homogeneity to about 500 ppm. A further enhancement upon this performance is changing the middle portions of the disk permanent magnets, 117a and 117b to a ferromagnetic material. As Case 3 shows, doing so adds about 30 G and has minimal impact on the central field value. However small this change is though the benefit from this part of the invention is for the assembly part of the magnet because the magnetic forces are significantly reduced if the disk magnets are split into at least two halves before insertion into the magnetic circuit. Furthermore, the flux lines are pulled back towards the returns away from the central portion of the magnet by making elements 117a and 117b a ferromagnetic material which aids in reducing the saturation of the L-poles.

A similar insertion of a ferromagnetic material, 113, in the middle of the ring magnets does not have a beneficial result as shown in Case 4. However, splitting the rings and leaving an air region as in Case 5 reduces the central field by about 100 G without to much effect on the homogeneity. As discussed previously, this enables the mechanical adjustment of these two rings separately. The upper ring adjusts the central field value while the lower adjusts both the homogeneity and the saturation of the L-poles.

Cases 6-9 are studies on the effect of changing the magnetization orientation of the different parts of the disk magnets away from the vertical orientation of 90°. For these studies, 113 is again a permanent magnet as indicated in the table. In Case 6, the lower, outer disk portion, 126, has a magnetization orientation of 70° instead of 90°. As shown in the table the central field value is increased by about 110 G but comes at the cost of reducing the homogeneity and worsening the saturation of the L-poles. If the magnetization orientation of element 128 is 110° instead of 90° as in Case 7, the central field value drops by about 50 G and the homogeneity deteriorates to 1000 ppm but the saturation of the L-poles is completely removed with an average magnetic field value throughout the base region of only about 12,000 G. This is a very significant gain for the overall performance of the magnet system. Case 8 is a check of tilting the magnetization of 128 to 70' instead of 110°. The results are similar. As Case 9 shows there is not much change from Case 2 and this series of studies shows that adjusting the magnetization orientation of the lower portion of the disk magnets 126 and 128 has more significant benefits than the upper portions which only affect the flux flows in the T-yokes.

Case 10 is a check on the effect of just changing the magnetization orientation in the upper portion of the ring magnet 124. The result clearly shows that the central field value is increased by about 30 G without any effect on the homogeneity. Therefore, adjustments of this portion of the ring magnet give fine control over the central field value. Case 11 shows the benefits of changing the edge portion of the L-poles, 111 to a permanent magnet. It adds about 250 G to the central field value and significantly reduces the overall saturation of the L-poles. In contrast changing the Rose shims, 118, to permanent magnets, Case 12, has a similar effect as well and varying the magnetization orientation adjusts saturation of the L-poles and the overall homogeneity.

In more practical implementations of this magnet system a polygonal shape to the L-magnets and the L-poles is easier in which case the sections have to be at least 8 and preferably 32 or more for a better circumferential approximation. Furthermore, having a slight gap between the disk and ring portions of the L-magnets allows room for mechanically adjusting the ring magnets.

In summary, this new magnet invention has substantial benefits over previous or conventional permanent magnet based magnet designs including but not limited to:
1. minimal thermal drifts because the poles are not saturated;
2. eddy currents will be reduced because high resistivity materials can be used and will not be rendered inoperable by the poles being saturated as in conventional designs;
3. poles that operate in the linear region throughout the pole volume generate an inherently much higher homogeneous magnetic fields in the air gap as compared to conventional designs;
4. the magnet is easily shimmable because of point #3;
5. the very high efficiency of the design means less demanding materials can be used throughout the magnet;
6. the non-saturation of the poles allows the use of low saturation point, soft magnetic materials;
7. the poles operate in the theoretically desired regime of approaching an infinite permeability medium so the surfaces behaves as true constant potential;
8. higher magnetic field designs are possible.

This breakthrough in permanent magnet design can yield practical designs for whole-body MRI permanent magnet based systems of field strengths up to 10 T or more. In the examples considered throughout this patent the conventional designs in FIG. 1 yielded fields in the air gap of about 0.45 T and operating points of the permanent magnets of about 0.7 T. The new designs, using the same dimensions of the conventional design of FIG. 1 with the addition of the ring permanent magnets and ring yoke yielded fields of 0.75 T in the air gap and operating points of the permanent magnets of 0.7 T as depicted in FIG. 16. The two designs yield completely different performances. In particular, the new design is a much more efficient magnetic circuit and exhibits no saturation in the poles, yokes and returns.

The drawings and descriptions while demonstrating the main objects of the invention, together with the claims below are in on way meant to limit the scope and spirit of the invention. Changes in form and details of the invention will be understood not to depart from the current invention.

What is claimed is:

1. A magnet for use in MRI applications, said magnet generally comprising:
   i. a pair of solid disk-like permanent magnets oriented about a plane of symmetry parallel to each to define an air gap region and wherein each solid disk-like permanent magnet includes an outer permanent magnet ring offset and extending towards the air gap region to form an L-magnet to allow the pair of L-magnets to be utilized as magnetic field sources;
   ii. a pair of disk-like poles wherein one pole is disposed to be secured on each one of the L-magnets on the sides facing the air gap region and wherein each pole further includes a ring-like section on an outer edges abutting the inside of the permanent magnet rings to form an L-pole;
   iii. the pair of L-magnets each having disposed on them a tapered disk-like yoke with an annular ring section that substantially abuts the permanent magnet ring so a T-yoke is formed on their surfaces opposite the air gap region; and
   iv. the pair of T-yokes connected to each other by returns so that the entire magnet assembly can form a closed magnetic flux circuit to substantially confine the magnetic fields in said air gap, L-poles, L-magnets, T-yokes and returns whereby said air gap, being cylindrical in geometry, forms an imaging region to place subjects for the purposes of examination.

2. The magnet of claim 1 wherein, the outer permanent magnet section of the L-magnets is part of the ring section of the L-poles.

3. The magnet of claim 1 wherein each L-magnet further comprises:

i. a disk-like permanent magnet section being magnetized substantially in the axial direction;
ii. said annular outer permanent magnet ring section being magnetized substantially in the radial direction;
iii. said first L-magnet of the pair having its disk-like permanent magnet section main magnetization orientation pointed axially with the North Pole pointing towards the T-yoke so that said adjacent annular outer permanent magnet ring portion relative to this orientation has its main magnetization orientation pointed radially out;
iv. said second L-magnet of the pair will have its disk-like permanent magnet section main magnetization orientation pointed axially as well with the North Pole pointing away from the T-yoke so that said adjacent annular outer permanent magnet ring portion of this second L-magnet of the pair relative to this orientation has its main magnetization orientation pointed radially in; and
v. an opposite orientation for the pair of L-magnets being possible if in the first L-magnet of the pair the North Pole for the magnetization in the disk portion points away from the T-yokes and said adjacent ring section magnetization points radially in so that in the second L-magnet of the pair the disk portion magnetization has the North Pole pointing towards the T-yokes and the ring portion pointing radially out.

4. The magnet of claim 3 wherein,
i. said disk-like sections of each L-magnet are polygonal in shape; and
ii. said ring sections of each L-magnet are polygonal in shape.

5. The magnet of claim 4 wherein each L-magnet further comprises:
i. said disk-like or polygonal section having subsections that are substantially axially magnetized but exhibiting slightly different axial magnetization orientations relative to each other; and
ii. within each said ring or polygonal section having subsections that are substantially radially magnetized but exhibiting slightly different radial magnetization orientations relative to each other.

6. The magnet of claim 5 wherein the separate ring portion of each L-magnet is disposed to be mechanically moved to allow adjustment of the central field and homogeneity.

7. The magnet of claim 3 wherein each L-magnet includes a ferromagnetic section disposed to reduce mechanical forces during assembly, increase central field value and reduce saturation of the L-poles.

8. The magnet of claim 1 wherein each T-yoke further comprises:
i. a support structure for the L-magnets;
ii. the tapered-like disc section being sufficiently massive to carry magnetic field flux through it without substantial leakage;
iii. the ring section of the T-yokes being sufficiently massive to carry magnetic field flux from the ring sections of the L-magnet;
iv. said ring section of the T-yokes being located adjacent to the ring portions of the L-magnets for an efficient and even flux distribution throughout the magnetic circuit; and
v. said ring section of the T-yokes containing all the magnetic flux within it without substantial leakage into surrounding magnetic circuit structures and air regions.

9. The magnet of claim 8 wherein each T-yoke further comprises:
i. said ring portion is disposed to improve the high reluctance path in the surrounding regions exclusive of the magnetic circuit, thereby enabling the return posts to be placed closer into the air gap; and
ii. said ring portion being tapered from the yoke end towards the air-gap end.

10. The magnet of claim 9 wherein the ring portion of each T-yoke is disposed to be a permanent magnet with magnetization orientation substantially in the axial direction to extend the homogeneous region in the air gap and aid shimming of the central imaging region.

11. The magnet of claim 1 wherein
the disc-like poles is made of a magnetic material and the outer circumferential edge of said disc-like poles is comprised of a permanent magnet material.

12. The magnet of claim 1 wherein each L-pole includes a side of said ring section protruding into the air gap and is made of a permanent magnet material, and wherein the side facing said L-magnets is made of a low-carbon steel material.

* * * * *